(12) United States Patent
Lee

(10) Patent No.: US 8,120,966 B2
(45) Date of Patent: Feb. 21, 2012

(54) METHOD AND APPARATUS FOR MANAGEMENT OF OVER-ERASURE IN NAND-BASED NOR-TYPE FLASH MEMORY

(75) Inventor: Peter Wung Lee, Saratoga, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 144 days.

(21) Appl. No.: 12/658,121

(22) Filed: Feb. 3, 2010

(65) Prior Publication Data

US 2010/0195404 A1 Aug. 5, 2010

Related U.S. Application Data

(60) Provisional application No. 61/207,020, filed on Feb. 5, 2009.

(51) Int. Cl.
*G11C 11/34* (2006.01)

(52) U.S. Cl. .......... 365/185.22; 365/185.29; 365/185.18

(58) Field of Classification Search ............. 365/185.22, 365/185.29, 185.18, 185.3, 185.33
See application file for complete search history.

(56) References Cited

U.S. PATENT DOCUMENTS

| | | | |
|---|---|---|---|
| 4,601,020 A | 7/1986 | Arakawa et al. |
| 4,761,768 A | 8/1988 | Turner et al. |
| 5,287,317 A | 2/1994 | Kobayashi et al. |
| 5,490,109 A | 2/1996 | Salmon |
| 5,563,827 A | 10/1996 | Lee et al. |
| 5,596,523 A | 1/1997 | Endoh et al. |
| 5,596,530 A | 1/1997 | Lin et al. |
| 5,699,296 A | 12/1997 | Song |
| 5,768,192 A | 6/1998 | Eitan |
| 5,796,657 A | 8/1998 | Lee et al. |
| 5,862,082 A | 1/1999 | Dejenfelt et al. |
| 5,920,501 A | 7/1999 | Norman |
| 6,005,810 A | 12/1999 | Wu |

(Continued)

FOREIGN PATENT DOCUMENTS

EP 0 640 983 3/1995

(Continued)

OTHER PUBLICATIONS

"A New Self-Data-Refresh Scheme for a Sector Erasable 16 Mb Flash EEPROM," by Akira Umezawa et al., VLSI 12-2, pp. 99-100.

(Continued)

*Primary Examiner* — Son Dinh
(74) *Attorney, Agent, or Firm* — Saile Ackerman LLC; Stephen B. Ackerman; Billy Knowles

(57) ABSTRACT

A method and apparatus for operating an array block of dual charge retaining transistor NOR flash memory cells by erasing the dual charge retaining transistor NOR flash memory cells to set their threshold voltage levels to prevent leakage current from corrupting data during a read operation. Erasure of the array block of NOR flash memory cells begins by selecting one of block section of the array block and erasing, erase verifying, over-erase verifying, and programming iteratively until the charge retaining transistors have their threshold voltages between the lower limit and the upper limit of the first program state. Other block sections are iteratively selected and erased, erased verified, over-erase verified, and programmed repeatedly until the charge retaining transistors have their threshold voltages between the lower limit and the upper limit of the first program state until the entire block has been erased and reprogrammed to a positive threshold level.

71 Claims, 13 Drawing Sheets

U.S. PATENT DOCUMENTS

| | | | |
|---|---|---|---|
| 6,163,048 | A | 12/2000 | Hirose et al. |
| 6,233,198 | B1 | 5/2001 | Choi |
| 6,265,266 | B1 | 7/2001 | Dejenfelt et al. |
| 6,333,500 | B2 | 12/2001 | Gehring et al. |
| 6,356,478 | B1 | 3/2002 | McCollum |
| 6,396,744 | B1 | 5/2002 | Wong |
| 6,407,948 | B1 | 6/2002 | Chou |
| 6,498,752 | B1 | 12/2002 | Hsu et al. |
| 6,556,481 | B1 | 4/2003 | Hsu et al. |
| 6,614,070 | B1 | 9/2003 | Hirose et al. |
| 6,620,682 | B1 | 9/2003 | Lee et al. |
| 6,628,563 | B1 | 9/2003 | Hsu et al. |
| 6,665,211 | B2 | 12/2003 | Kern |
| 6,756,632 | B1 | 6/2004 | Chen et al. |
| 6,765,825 | B1 | 7/2004 | Scott |
| 6,777,292 | B2 | 8/2004 | Lee et al. |
| 6,788,611 | B2 | 9/2004 | Hsu et al. |
| 6,788,612 | B2 | 9/2004 | Hsu et al. |
| 6,818,491 | B2 | 11/2004 | Lee et al. |
| 6,822,223 | B2 | 11/2004 | Davis |
| 6,828,563 | B2 | 12/2004 | Ducourant |
| 6,847,087 | B2 | 1/2005 | Yang et al. |
| 6,862,223 | B1 | 3/2005 | Lee et al. |
| 6,871,258 | B2 | 3/2005 | Micheloni et al. |
| 6,931,480 | B2 | 8/2005 | Swaminathan |
| 7,035,967 | B2 | 4/2006 | Chang et al. |
| 7,064,978 | B2 | 6/2006 | Lee et al. |
| 7,075,826 | B2 | 7/2006 | Lee et al. |
| 7,087,953 | B2 | 8/2006 | Lee |
| 7,102,929 | B2 | 9/2006 | Lee et al. |
| 7,110,302 | B2 | 9/2006 | Lee et al. |
| 7,120,064 | B2 | 10/2006 | Lee et al. |
| 7,141,474 | B2 | 11/2006 | Ichige et al. |
| 7,203,092 | B2 | 4/2007 | Nazarian |
| 7,259,992 | B2 * | 8/2007 | Shirota .................... 365/185.21 |
| 7,263,003 | B2 | 8/2007 | Edahiro et al. |
| 7,280,408 | B2 | 10/2007 | Guterman et al. |
| 7,283,401 | B2 | 10/2007 | Lee et al. |
| 7,289,366 | B2 | 10/2007 | Lee et al. |
| 7,324,379 | B2 | 1/2008 | Del Gatto et al. |
| 7,324,384 | B2 | 1/2008 | Lee et al. |
| 7,332,766 | B2 | 2/2008 | Hasegawa et al. |
| 7,359,245 | B2 | 4/2008 | Kim et al. |
| 7,359,274 | B2 | 4/2008 | Noguchi et al. |
| 7,411,822 | B2 | 8/2008 | Specht et al. |
| 7,411,827 | B2 | 8/2008 | Guterman et al. |
| 7,453,732 | B2 * | 11/2008 | Devin ...................... 365/185.22 |
| 7,468,914 | B2 * | 12/2008 | Toda ......................... 365/185.2 |
| 7,499,329 | B2 | 3/2009 | Nazarian |
| 7,505,324 | B2 | 3/2009 | Umezawa et al. |
| 7,505,355 | B2 | 3/2009 | Kanda et al. |
| 7,539,053 | B2 | 5/2009 | Kanda |
| 7,636,252 | B2 | 12/2009 | Lee et al. |
| 2004/0099914 | A1 | 5/2004 | Yang et al. |
| 2008/0158998 | A1 | 7/2008 | Choi |
| 2009/0279360 | A1 | 11/2009 | Lee et al. |
| 2009/0310405 | A1 | 12/2009 | Lee et al. |
| 2009/0310411 | A1 | 12/2009 | Lee et al. |
| 2009/0310414 | A1 | 12/2009 | Lee et al. |
| 2009/0316487 | A1 | 12/2009 | Lee et al. |

FOREIGN PATENT DOCUMENTS

| | | |
|---|---|---|
| WO | PCT/US09/02817 | 6/2009 |
| WO | PCT/US09/03329 | 7/2009 |
| WO | PCT/US10/00318 | 4/2010 |

OTHER PUBLICATIONS

"A Dual-Mode NAND Flash Memory: 1-Gb Multilevel and High-Performance 512-Mb Single-Level Modes," by Taehee Cho et al., IEEE Journal of Solid-State Circuits, vol. 36, No. 11, Nov. 2001, pp. 1700-1706.

Co-Pending, U.S. Appl. No. 12/291,913, filed Nov. 14, 2008, A Bit Line Gate Transistor Structure for a Multilevel, Dual-Sided Nonvolatile Memory Cell NAND Flash Array, assigned to the same assignee as the present invention.

"Intel StaraFlash TM Memory Technology Overview," by Atwood et al., Intel Technology Journal, vol. 1, Issue 2, Q4 1997, found www.intel.com, Apr. 23, 2007, pp. 1-8.

Intel StrataFlash TM Memory Technology Development and Implementation, by Al Fazio et al., Intel Technology Journal, vol. 1, Issue 2, Q4 1997, found www.intel.com, Apr. 21, 2009, pp. 1-13.

"ETOX TM Flash Memory Technology: Scaling and Integration Challenges," by Fazio et al., Intel Technology Journal, vol. 6, Issue 2, May 16, 2002, found www.intel.com, Apr. 21, 2009, pp. 23-30.

\* cited by examiner

| CELL | Program Scheme | Erase Scheme | Source Line |
|---|---|---|---|
| ETOX-based NOR | CHE | FN | Run X-direction in Parallel |
| NAND-based NOR | FN | FN | Run Y-direction in Parallel |

FIG. 6a

| Voltage \ Mode | SLC | | MLC | |
|---|---|---|---|---|
| | Vpass | Vvfy | Vpass | Vvfy |
| Erase Verify | 6.5V | VtOH | 6.5V | VtOH |
| Over-Erase Verify | 6.5V | VtOL | 6.5V | VtOL |
| Program Verify | 6.5V | VtOL/Vt1L | 6.5V | VtOL/Vt1L /Vt2L/Vt3L |

FIG. 6b

| Voltage \ Mode | SLC | | MLC | |
|---|---|---|---|---|
| | Vpass | Vr | Vpass | Vr |
| Fast Read | VH1F | VrSLC | VH1F | VrMLC1/ VrMLC2/ VrMLC3 |
| Slow Read | VH1S | VrSLC | VH1S | VrMLC1/ VrMLC2/ VrMLC3 |

FIG. 6c

| I/O MODE | UNSEL PAGE WL UNSEL | SELECTED PAGE WL SEL | SELECTED PAGE WL UNSEL | BIT LINE/SOURCE LINE I/O BLG SEL | BLG UNSEL | CBLn | SLG SEL | SLG UNSEL | GSLn | DIFFUSION WELLS TPW | DNW |
|---|---|---|---|---|---|---|---|---|---|---|---|
| READ | 0V | $V_R$ | VPASS | VDD | 0V | 1V | VDD | 0V | 0V | 0V | VDD |
| ERASE | +20V | 0V | +20V | +20V | NA | FLT | +20V | NA | FLT | +20V | +20V |
| ERASE VERIFY | 0V | $V_{tOH}$ | VPASS | VDD | 0V | 1V | VDD | 0V | 0V | 0V | VDD |
| OVER-ERASE VERIFY | 0V | $V_{tOL}$ | VPASS | VDD | 0V | 1V | VDD | 0V | 0V | 0V | VDD |
| PROGRAM | +5V | +15V–+20V | +5V | +10V | 0V | INH=+10V PRG=0V | 0V | +10V | INH=+10V PRG=0V | 0V | VDD |
| PROGRAM VERIFY | 0V | $V_{tOL}/V_{tOH}$ | VPASS | VDD | 0V | 1V | VDD | 0V | 0V | 0V | VDD |

FIG. 9

METHOD AND APPARATUS FOR MANAGEMENT OF OVER-ERASURE IN NAND-BASED NOR-TYPE FLASH MEMORY

This application claims priority under 35 U.S.C. §119 to U.S. Provisional Patent Application Ser. No. 61/207,020, filed on Feb. 5, 2009, which is herein incorporated by reference in its entirety.

RELATED PATENT APPLICATIONS

U.S. patent application Ser. No. 12/387,771, filed on May 7, 2009, assigned to the same assignee as the present invention, and incorporated herein by reference in its entirety.

U.S. patent application Ser. No. 12/455,337, filed on Jun. 1, 2009, assigned to the same assignee as the present invention, and incorporated herein by reference in its entirety.

BACKGROUND OF THE INVENTION

1. Field of the Invention

This invention relates generally to nonvolatile memory array structures and operation of the nonvolatile memory array structures. More particularly, this invention relates to a dual charge retaining transistor NOR nonvolatile memory device structures and circuits and methods of operation of dual charge retaining transistor NOR nonvolatile memory device structures.

2. Description of Related Art

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular types of Nonvolatile Memory. Flash Memory has the combined advantages of the high density, small silicon area, low cost and can be repeatedly programmed and erased with a single low-voltage power supply voltage source.

The Flash Memory structures known in the art employ a charge retaining mechanism such as a charge storage or a charge trapping. In a charge storage mechanism, as with a floating gate nonvolatile memory, the charge representing digital data is stored on a floating gate of the device. The stored charge modifies the threshold voltage of the floating gate memory cell to determine the digital data stored in the floating gate nonvolatile memory cell. In a charge trapping mechanism, as in a Silicon-Oxide-Nitride-Oxide-Silicon (SONOS) or Metal-Oxide-Nitride-Oxide-Silicon (MONOS) type cell, the charge is trapped in a charge trapping layer between two insulating layers. The charge trapping layer in the SONOS/MONOS devices has a relatively high dielectric constant (k) such Silicon Nitride ($SiN_x$).

A present day flash nonvolatile memory is divided into two major product categories such as the fast random-access, asynchronous NOR flash nonvolatile memory and the slower serial-access, synchronous NAND flash nonvolatile memory. NOR flash nonvolatile memory as presently designed is the high pin-count memory with multiple external address and data pins along with appropriate control signal pins. One disadvantage of NOR flash nonvolatile memory is as the density is doubled, the number of its required external pin count increases by one due to the adding of one more external address pin to double the address space. In contrast, NAND flash nonvolatile memory has an advantage of having a smaller pin-count than NOR with no address input pins. As density increases, the NAND flash nonvolatile memory pin count is always kept constant. Both main-streamed NAND and NOR flash nonvolatile memory cell structures in production at the present time use one charge retaining (charge storage or charge trapping) transistor memory cell that stores one bit of data as charge or as it commonly referred to as a single-level program cell (SLC). They are respectively referred as one-bit/one transistor NAND cell or NOR cell, storing a single-level programmed data in the cell.

The NAND and NOR flash nonvolatile memories provide the advantage of in-system program and erase capabilities and have a specification for providing at least 100K endurance cycles. In addition, both single-chip NAND and NOR flash nonvolatile memory products can provide giga-byte density because their highly-scalable cell sizes. For instance, presently a one-bit/one transistor NAND cell size is kept at $\sim4\lambda^2$ ($\lambda$ being a minimum feature size in a semiconductor process), while NOR cell size is $\sim10\lambda^2$. Furthermore, in addition to storing data as a single-level program cell having two voltage thresholds (Vt0 and Vt1), both one transistor NAND and NOR flash nonvolatile memory cells are capable of storing at least two bits per cell or two bits/one transistor with four multi-level threshold voltages (Vt0, Vt1, Vt2 and Vt03) in one physical cell. The multi-level threshold voltage programming of the one transistor NAND and NOR flash nonvolatile memory cells is referred to as multiple level programmed cells (MLC).

Currently, the highest-density of a single-chip double polycrystalline silicon gate NAND flash nonvolatile memory chip is 64 Gb. In contrast, a double polycrystalline silicon gate NOR flash nonvolatile memory chip has a density of 2 Gb. The big gap between NAND and NOR flash nonvolatile memory density is a result of the superior scalability of NAND flash nonvolatile memory cell over a NOR flash nonvolatile memory. A NOR flash nonvolatile memory cell requires 5.0V drain-to-source (Vds) to maintain a high-current Channel-Hot-Electron (CHE) injection programming process. Alternately, a NAND flash nonvolatile memory cell requires 0.0V between the drain to source for a low-current Fowler-Nordheim channel tunneling program process. The above results in the one-bit/one transistor NAND flash nonvolatile memory cell size being only one half that of a one-bit/one transistor NOR flash nonvolatile memory cell. This permits a NAND flash nonvolatile memory device to be used in applications that require huge data storage. A NOR flash nonvolatile memory device is extensively used as a program-code storage memory which requires less data storage and requires fast and asynchronous random access.

The act of programming of a Flash nonvolatile memory cell involves charging the charge retaining region (floating gate or charge trapping layer) with electrons which causes the turn-on threshold voltage level of the memory cell to increase. Thus, when programmed, the a Flash nonvolatile memory cell will not turn on; that is, it will remain non-conductive, when addressed with a read potential applied to its control gate. Alternately, the act of erasing a Flash nonvolatile memory cell involves removing electrons from the floating gate to lower the threshold voltage level. With the lower threshold voltage level, a Flash nonvolatile memory cell will turn on to a conductive state when addressed with a read potential to the control gate. However, a Flash nonvolatile memory cell suffers from the problem of over-erasure. Over-erasure occurs if, during the erasing step, too many electrons are removed from the floating gate leaving a slight positive charge. This biases the memory cell slightly on, so that a small current may leak through the memory cell even when it is not addressed.

Currently, as discussed in U.S. Pat. No. 6,407,948 (Chou), the most commonly used Flash memory erasing methods employ the Fowler-Nordheim tunneling phenomena and the channel hot-electron tunneling phenomena. In an erasing procedure of for a Flash nonvolatile memory cell, a voltage is continually applied to a Flash nonvolatile memory cell to generate a voltage field with a negative potential difference between the control gate and the drain or channel of a Flash nonvolatile memory cell. Electrons accumulated in the floating gate of a Flash nonvolatile memory cell are reduced because the electrons pass through a thin dielectric layer of the Flash nonvolatile memory cell to cause a reduction of the threshold voltage of the Flash memory cell. When the erasing procedure is performed, an erasing voltage pulse is applied to each Flash memory cell of a Flash memory array to erase all of the Flash memory cells in the array. However, not all of the Flash memory cells of the Flash memory array have the same circuit characteristics. Some of the Flash memory cells will suffer over-erasure. An over-erased Flash memory cell is one in which a threshold voltage is less than +0.5 volts. When the Flash memory array has multiple over-erased Flash memory cells on multiple columns of the Flash memory cells, the Flash nonvolatile memory cell operates as though it were a depletion device and provides a leakage current. This leakage current causes the data reading accuracy of the Flash memory array to be adversely affected. During a read operation of selected a Flash nonvolatile memory cells, the bit line connected to the selected Flash memory cell is also connected to any over-erased Flash memory cells connected to the bit line. The bit line will suffer from excess leakage current while reading the non-conducting Flash memory cell.

SUMMARY OF THE INVENTION

An object of this invention is to provide a method and apparatus for operation of a NAND-like dual charge retaining transistor NOR flash memory cell for the management of over-erasure.

Another object of this invention is to provide a method and apparatus for erasing and programming of dual charge retaining transistor NOR flash memory cells to set a threshold voltage level of the erased dual charge retaining transistor NOR flash memory cells to prevent leakage current from corrupting data during a read or verification operation.

To accomplish at least one of these objects, an embodiment includes a method of operation for the NAND-like dual charge retaining transistor NOR flash memory cells by erasing, verifying erasing, verifying over-erasing, programming, and program verifying the dual charge retaining transistor NOR flash memory cells. A block of an array of the NOR flash memory cells are arranged in rows and columns. The block forming a sub-array of the array of NOR flash memory cells. Each of NOR flash memory cells is formed of two serially connected charge retaining transistors. A drain/source of a first of the two charge retaining transistors connected to a local bit line and a source/drain of a second of the two charge retaining transistors connected to a local source line. The local bit line is connected to a global bit line through a bit line gating transistor and the local source line is connected to a global source line through a source line gating transistor. The control gates of each of the first charge retaining transistors on each row of NOR flash memory cells is connected to a word line. The control gates of the second charge retaining transistors on the row of NOR flash memory cells are connected to a separate word line. Each row of the first charge retaining transistors forms a first page set of the charge retaining transistors and each row of the second charge retaining transistors forms a second page set of the charge retaining transistors.

With the threshold voltage levels of all cells of an array of dual charge retaining transistor NOR flash memory cells having positive threshold voltage levels to designate their programs states, erasure of the block of dual charge retaining transistor NOR flash memory cells begins by selecting a first half block of alternating pages of charge retaining transistors. A block of the array of dual charge retaining transistor NOR flash memory cells has two half blocks where each half blocks includes the pages of alternating rows of the dual charge retaining transistor NOR flash memory cells. The to dual charge retaining transistor NOR flash memory cells of the first half block are simultaneously and collectively erased. The erased dual charge retaining transistor NOR flash memory cells are then verified on a page by page basis to ensure that the first selected half block of charge retaining transistors have their voltage threshold levels less than the upper limit of a first program state. If any of the charge retaining transistors of the first selected half block have their threshold voltage levels greater than the upper limit of the first program state, the first selected half block is erased and erase verified repetitively until all the charge retaining transistors in the first-half block have their threshold voltage levels less than the upper limit of the first program state. The first selected half block of charge retaining transistors is then over-erase verified page by page to determine that their threshold voltage level is greater than a lower limit of the first program state. If any of the charge retaining transistors has their threshold voltage levels less than a lower limit of the first program state, those charge retaining transistors are then programmed page by page and over-erase verified until their threshold voltage (Vt) levels to be greater than the lower limit of the first program state.

Upon completion of erasing and programming of the first selected half block of the charge retaining transistors to have their threshold voltages between the lower limit of the first program state and the upper limit of the first program state, the second-half block of the block of dual charge retaining transistor NOR flash memory cells is subsequently chosen and erased, erased verified, over-erase verified, and programmed until the charge retaining transistors of the second selected half block have their threshold voltages between the lower limit of the first program state and the upper limit of the first program state.

Page erasure of a single page of the charge retaining transistor having positive threshold voltage levels to designate their programs states begins by selecting one page and inhibiting the unselected pages from erasure. The dual charge retaining transistor NOR flash memory cells of the selected page are erased and then erase verified to confirm that the threshold voltage levels of the charge retaining transistors are less than the upper limit of the first program state. If any of the dual charge retaining transistor NOR flash memory cells of the selected page have their threshold voltages greater than the upper limit of the first program state, the dual charge retaining transistor NOR flash memory cells are repetitively erased and erase verified until the threshold voltage levels are all less than the upper limit of the first program state. The page of charge retaining transistors is then over-erase verified to confirm that their threshold voltage level is greater than the lower limit of the first program state. If the threshold voltage levels of any of the charge retaining transistors are less than the lower limit of the first program state, they are programmed and over-erase verified until all the threshold voltage levels are greater than the lower limit of the first program state.

Page programming of a single page of the charge retaining transistor to have set their threshold voltage level to the positive threshold voltage levels that designate their programs states begins by selecting one page and inhibiting the unselected pages from programming. Programming the selected page of the charge retaining transistors begins by the page erase of the selected page of charge retaining transistors. At the completion of the page erasing, all the charge retaining transistor of the page are programmed to have a threshold voltage level that is greater than the lower limit of the first program state and less than the upper limit of the first program state. Those charge retaining transistors that are to be programmed to a second program state are then further programmed and program verified to have their threshold voltage levels greater than a lower limit of the second program state. If the page of charge retaining transistors is to be programmed with more than two program states, those charge retaining transistors that are to be further programmed to the additional program states are programmed and program verified to those program states.

In various embodiments, each column of the dual charge retaining transistor NOR flash memory cells is associated with a local bit line and local source line that are placed in parallel with the column of the dual charge retaining transistor NOR flash memory cells. The local bit lines and local source lines of pairs of columns of the array of NOR flash memory cells share a global bit line and global source line. In an erase verification, an over-erase verification, a program verification, and read operation, a selected page on one set of columns of the column pairs is selected for reading and the other set of the column pairs are inhibited from reading. The read operation determines if the selected charge retaining transistors have their voltage threshold greater than or less than a read voltage level to determine the program state retained within the charge retaining transistors. In the case of the charge retaining transistor being programmed with more than two data states there are multiple read voltage levels to determine which of the multiple programmed data states is programmed to the charge retaining transistors.

In another embodiment, a NAND-like NOR flash nonvolatile memory device includes an array of blocks of NOR flash memory cells arranged in rows and columns. Each of NOR flash memory cells is formed of at least two serially connected charge retaining transistors. A drain/source of a first of the at least two charge retaining transistors connected to a local metal bit line and a source/drain of a second of the at least two charge retaining transistors connected to a local metal source line. The local metal bit line is connected to another global metal bit line through a bit line gating transistor and the local metal source line is connected to another global metal source line through a source line gating transistor. The control gates of each of the first charge retaining transistors on each row of NOR flash memory cells is connected to a word line. The control gates of the second charge retaining transistors on the row of NOR flash memory cells are connected to a separate word line. Each row of the first charge retaining transistors forms a first even page set of the charge retaining transistors and each row of the second charge retaining transistors forms a second odd page set of the charge retaining transistors.

A row control circuit is connected to each word line connected to the control gates of each row of the NAND-like NOR flash memory cells. The row control circuit is connected to bit line select lines that are connected to the gates of the bit line gating transistors each of the associated bit lines. The bit line gating transistors connect each global bit line to its associated local bit lines. Further, the row control circuit is connected to source line select lines that are connected to the gates of the associated source line gating transistors. The source line gating transistors connect each global source line to its associated local source lines.

The row control circuit has an erase voltage generation circuit for generating a very large erase inhibit voltage of from approximately +18.0V to approximately +22.0V (nominally +20.0V) and the erase voltage that is the ground reference voltage level. Further, the row control circuit has a read/verify voltage generator for generating the read voltage levels, the erase and over-erase verify voltage levels, the pass voltage level, the voltage level of the power supply voltage source, and the ground reference voltage level. The row control circuit includes a program voltage generator for generating a very large program voltage of approximately +15.0V to approximately +22.0V, a large program inhibit gating voltage of approximately +10.0V, a moderately large program inhibit voltage of approximately +5.0V, and the ground reference voltage level. The program voltage generator, the erase voltage generator, and the read/verify voltage generator are connected to a row select circuit that transfers the erase voltage levels, the erase inhibit voltage levels, the erase verify voltage levels, the program voltage levels, the program inhibit voltage levels, the program verify voltage levels, and the read voltage levels to the word lines of the array, the gates of the bit line select transistors, and the gates of the source line transistors.

The row voltage control circuit has a control decoder that receives a control code to determine if the array is to be erased, programmed or read. An address decoder receives an address code that determines the location of the operation provided by the control decoder. The control decoder transfers the decoded control codes to the program voltage generator, the erase voltage generator, and the read/verify voltage generator to define the desired operation of erase, program, or read. The address decoder is connected to the row selector to determine the row location of the NOR flash memory cells that are to be programmed, erased, or read.

The row selector has a bit line select control circuit to apply the bit line gating voltages to the bit line select transistors to connect or disconnect the global metal bit lines to the local metal bit lines as appropriate for the erase, program, or read. The row selector, further, has a source line select control circuit to apply the source line gating voltages to the source line select transistors to connect or disconnect the global metal source lines to the local metal source lines as appropriate for the erase, program, or read.

A column voltage control circuit is connected to each of the global metal bit lines and global metal source lines connected to the columns of the array of NAND-like NOR flash memory cells. The column voltage control circuit has a column program circuit for generating a program inhibit voltage that is applied selectively to the drain/sources or source/drains for inhibiting programming of the unselected charge retaining transistors. The column program control circuit further selectively provides a ground reference voltage for providing the necessary voltage field between the control gate and the sources and drains of the selected charge retaining transistors being programmed. The column voltage control circuit has a read circuit that provides the read bias voltage to the selected charge retaining transistors. A sense amplifier is connected to the selected bit lines to receive a current that is based on threshold voltage level of the selected charge retaining transistors.

The column voltage control circuit has a well bias control circuit that includes a shallow well generator and a deep well generator. The deep well generator is connected to a deep diffusion well of a first conductivity type (N-type) that is diffused into a surface of the substrate. A shallow diffusion well of a second conductivity type (P-type) is diffused into the deep diffusion well of the first conductivity type. The shallow diffusion well of the second conductivity type is connected to the shallow well generator. The deep well generator generates a voltage level of the power supply voltage source for programming, verification, and reading of the array of NOR flash memory cells and generates a very large erase voltage during the erasing a selected block or a page of the array of NOR flash memory cells. The shallow well generator transfers the voltage level of the ground reference voltage source (0.0V) for programming, verification, and reading of the array of NOR flash memory cells. The shallow well generator generates a very large erase voltage level that is applied to the shallow well of the second conductivity type to attract the charges from the charge retaining region during an erase. The very large erase voltage that is generated by the deep well generator and the shallow well generator prevent undesired forward currents between the deep diffusion well and the shallow diffusion well.

The column voltage control circuit has a control decoder that receives a control code to determine if the array is to be erased, programmed or read. An address decoder receives an address code that determines the location (which columns) of the operation provided by the control decoder. The control decoder transfers the decoded control codes to the column program voltage generator, and the column read/verify voltage generator and the well biasing circuit to define the desired operation of erase, program, or read. The address decoder is connected to the column selector to determine which column locations of the NOR flash memory cells that are to be programmed, erased, or read. In an erase operation the column selector disconnects the global metal bit lines and global metal source lines to allow them to float.

With the threshold voltage levels of all cells of an array of dual charge retaining transistor NOR flash memory cells having positive threshold voltage levels to designate their programs states, erasure of the block of dual charge retaining transistor NOR flash memory cells begins by the word line voltage control circuit selecting for erasing a first half block of alternating pages of charge retaining transistors. A block of the array of dual charge retaining transistor NOR flash memory cells has two half blocks where each half blocks includes the pages of alternating rows of the dual charge retaining transistor NOR flash memory cells. The dual charge retaining transistor NOR flash memory cells of the first half block are simultaneously and collectively erased. The word line voltage control circuit applies the ground reference voltage level to the selected word lines in the selected first half block and applies the very large erase inhibit voltage to the unselected word lines in the selected first half block. The bit line select circuit and the source line select circuit apply a very large select voltage level respectively to the gates of the bit line gating transistors and the source line gating transistors. The column control circuit causes the global metal bit lines and the global metal source lines to float. The very large erase voltage is applied to the shallow diffusion well of the second conductivity type and the deep diffusion well of first conductivity type.

At the completion of the block erase, the selected charge retaining transistors are then verified page by page to ensure that the a first half block of alternating pages of charge retaining transistors have their voltage threshold levels less than the upper limit of a first program state. The word line voltage control circuit applies a voltage level of the upper limit of a first program state to the selected word line. The word line voltage control circuit applies a ground reference voltage level to unselected word lines. The column voltage control circuit applies a read voltage level to the global metal bit lines and thus to the local metal bit lines of the NOR flash memory cells. The column voltage control circuits applies the ground reference voltage level to the global metal source lines and thus to the local metal source lines of the NOR flash memory cells. A sense amplifier is connected to the global metal bit lines and thus to the local metal bit lines to detect whether the threshold voltage level of the selected page of charge retaining transistor is less than the upper limit of a first program state. If any of the charge retaining transistors of the first half block have their threshold voltage level greater than the upper limit of the first program state, the selected first half block of charge retaining transistors is erased and erase verified repetitively until all the charge retaining transistors have their threshold voltage levels less than the upper limit of the first program state.

The selected first half block of charge retaining transistors is then over-erase verified that their threshold voltage level is greater than a lower limit of the first program state. The word line voltage control circuit applies a voltage level of the lower limit of a first program state to the selected word line. The word line voltage control circuit applies a ground reference voltage level to the unselected word lines. The column voltage control circuit applies a read voltage level to the global metal bit lines and thus to the local metal bit lines of the NOR flash memory cells. The column voltage control circuits applies the ground reference voltage level to the global metal source lines and thus to the local metal source lines of the NOR flash memory cells. A sense amplifier is connected to the global bit lines and thus to the local bit lines to detect whether the threshold voltage level of selected page of charge retaining transistor is greater than the lower limit of a first program state.

If any of the charge retaining transistors has their threshold voltage levels less than a lower limit of the first program state, those charge retaining transistors are then programmed and over-erase verified page by page to bring their threshold voltage levels to be greater than the lower limit of the first program state. To program the selected page, the word line controller applies the very large program voltage to the selected word line and the moderately large program inhibit voltage to the unselected word lines. The bit line and source line voltage controllers apply the appropriate bit line gate select and source line gate select voltages to the gates of the bit line select transistors and the gates of the source line select transistors to appropriately connect the global metal bit lines and the global metal source lines to the local metal bit lines and the local metal source lines. The column voltage control circuit applies the ground reference voltage level to the global metal bit lines or the global metal source lines and thus to the local metal bit lines and the local metal source lines for programming those of the charge retaining transistors where their threshold voltage level are less than the lower limit of a first program state. Similarly, the column voltage control circuit applies the large program inhibit voltage level to the global metal bit lines or global metal source lines and thus to the local metal bit lines and the local metal source lines for inhibiting the programming those of the charge retaining transistors that have their threshold voltage level greater than the lower limit of a first program state.

Upon completion of erasure of the first selected half block of charge retaining transistors, the second half block of alternating pages of charge retaining transistors is chosen and erased, erased verified, over-erased verified and programmed until the charge retaining transistors of the second half block of charge retaining transistors have their threshold voltages between the lower limit of the first program state and the upper limit of the first program state.

Erasure of a single page of the charge retaining transistors begins by the row voltage control circuit selecting the page and inhibiting the unselected pages from erasure. The selected page is erased by the word line voltage control circuit transferring ground reference voltage level to the selected word line. The word line voltage control circuit applies the very large erase inhibit voltage to the word lines of the unselected pages. The bit line select circuit and the source line select circuit apply a very large select voltage level respectively to the gates of the bit line gating transistors and the source line gating transistors to prevent the gate breakdown of the bit line and source line gating transistors. The row control circuit causes the global metal bit lines and the global metal source lines to float. The very large erase voltage is applied to the shallow diffusion well of the second conductivity type (p-type) and the deep diffusion well of first conductivity type (n-type). The very large erase voltage applied to the shallow diffusion well and the deep diffusion well prevent undesired forward currents between the deep diffusion well and the shallow diffusion well. The very large erase voltage as applied to the shallow diffusion well of the second conductivity type (p-type) is coupled to the drains and sources of the drains and sources of the floating gate transistors.

At the completion of the erase, the selected page of charge retaining transistors is then erase verified to ensure that the page of charge retaining transistors have their voltage threshold levels less than the upper limit of a first program state. The word line voltage control circuit applies a voltage level of the upper limit of a first program state to the selected word line. The word line voltage control circuit applies a ground reference voltage level to unselected word lines. The column voltage control circuit applies a read voltage level to the global metal bit lines and thus to the local metal bit lines of the NOR flash memory cells. The column voltage control circuits applies the ground reference voltage level to the global metal source lines and thus to the local metal source lines of the NOR flash memory cells. The sense amplifier is connected to the global bit lines and thus to the local bit lines to detect whether the threshold voltage level of selected page of charge retaining transistor is less than the upper limit of a first program state. If any of the charge retaining transistors of the selected page have their threshold voltage level greater than the upper limit of the first program state, the selected page of charge retaining transistor is erased and erase verified repetitively until all the charge retaining transistors have their threshold voltage levels less than the upper limit of the first program state.

The selected page of charge retaining transistors is then over-erase verified that the threshold voltage levels of all the charge retaining transistors is greater than a lower limit of the first program state. The word line voltage control circuit applies a voltage level of the lower limit of a first program state to the selected word line. The word line voltage control circuit applies a ground reference voltage level to unselected word lines. The column voltage control circuit applies a read voltage level to the global metal bit lines and thus to the local metal bit lines of the NOR flash memory cells. The column voltage control circuits applies the ground reference voltage level to the global metal source lines and thus to the local metal source lines of the NOR flash memory cells. The sense amplifier is connected to the global bit lines and thus to the local bit lines to detect whether the threshold voltage level of selected page of charge retaining transistor is greater than the lower limit of a first program state.

If any of the charge retaining transistors of the selected page has their threshold voltage levels less than a lower limit of the first program state, those charge retaining transistors are then programmed and over-erase verified to bring their threshold voltage levels to be greater than the lower limit of the first program state. To program the selected page, the word line controller applies the very large program voltage to the selected word line and the moderately large program inhibit voltage to the unselected word lines. The bit line and source line voltage controllers apply the appropriate bit line gate select and source line gate select voltages to the gates of the bit line select transistors and the gates of the source line select transistors to appropriately connect the local bit lines and the local source lines respectively to the global bit lines and the global source lines. The column voltage control circuit applies the ground reference voltage level to the global metal bit lines or the global metal source lines and thus to the local metal bit lines and the local metal source lines for programming those of the charge retaining transistors where their threshold voltage level are less than the lower limit of a first program state. Similarly, the column voltage control circuit applies the large program inhibit voltage level to the global metal bit lines or global metal source lines and thus the local metal bit lines and the local metal source to lines for inhibiting the programming those of the charge retaining transistors that have their threshold voltage level greater than the lower limit of a first program state.

Programming of a selected page of the charge retaining transistors begins by the page erase of the page of charge retaining transistor. In the page erase, all the charge retaining transistors of the page are programmed to have a threshold voltage level that is greater than the lower limit of the first program state and less than the upper limit of the first program state. Those charge retaining transistors that are to be programmed to a second program state are then programmed. To program a selected page to the second program state, the word line controller applies the very large program voltage to the selected word line and the moderately large program inhibit voltage to the unselected word lines. The bit line and source line voltage controllers apply the appropriate bit line gate select and source line gate select voltages to the gates of the bit line select transistors and the gates of the source line select transistors to appropriately connect the global metal bit lines and the global metal source lines to the local metal bit lines and the local metal source lines. The column voltage control circuit applies the ground reference voltage level to the global metal bit lines or the global metal source lines for programming those of the charge retaining transistors where their threshold voltage levels are less than the lower limit of a second program state. Similarly, the column voltage control circuit applies the large program inhibit voltage level to the global metal bit lines or global metal source lines and thus to selected local metal bit lines and selected local metal source lines for inhibiting the programming those of the charge retaining transistors that have their threshold voltage level greater than the lower limit of a second program state.

To verify that the selected charge retaining transistors are programmed to have their threshold voltage levels greater than a lower limit of the second program state, the word line voltage control circuit applies a voltage level of the lower limit of a second program state to the selected word line. The word line voltage control circuit applies a ground reference voltage level to unselected word lines. The column voltage control circuit applies a read voltage level to the global metal bit lines and thus to the local metal bit lines of the NOR flash memory cells. The column voltage control circuits applies the ground reference voltage level to the global metal source lines and thus to the local metal source lines of the NOR flash memory cells. The sense amplifier is connected to the global bit lines and thus to the local bit lines to detect whether the threshold voltage level of selected page of charge retaining transistors is greater than the lower limit of a second program state.

If the selected page of charge retaining transistors is to be programmed with more than two program states, those charge retaining transistors that are to be programmed to the additional program states are programmed and program verified to those program states. To program a selected page to the additional program states, the word line controller applies the very large program voltage to the selected word line and the moderately large program inhibit voltage to the unselected word lines. The bit line and source line voltage controllers apply the appropriate bit line gate select and source line gate select voltages to the gates of the bit line select transistors and the gates of the source line select transistors to appropriately connect the local metal bit lines and local metal source lines respectively to the global metal bit lines and the global metal source lines. The column voltage control circuit applies the ground reference voltage level to the bit lines or the source lines for programming those of the charge retaining transistors where their threshold voltage level are less than the lower limit of the additional program state. Similarly, the column voltage control circuit applies the large program inhibit voltage level to the global metal bit lines or global metal source lines and thus to the local metal bit lines and the local metal source lines for inhibiting programming those of the charge retaining transistors that that are designated to be programmed to the first or second program states. With each program iteration for programming the selected charge retaining transistors to their desired program states, the column voltage control circuit applies the large program inhibit voltage to the global metal bit lines or global metal source lines and thus to the local metal bit lines and the local metal source lines connected to the programmed charge retaining transistors that are correctly programmed to the previously programmed states.

In various embodiments, pairs of columns of the array of NOR flash memory cells share a global bit line and global source line. In a read operation, a selected page on one set of the column pairs is selected for reading and the other set of the column pairs are inhibited from reading. The bit line select control circuit applies a read select voltage level of approximately the power supply voltage source to the bit line select gating line to activate the selected column pair for reading. Similarly the source line select control circuit applies a read select voltage level of approximately the power supply voltage source to the source line select gating line to activate the selected column pair for reading. The word line voltage controller applies the read voltage level to the word line of selected page of charge retaining transistors. The read voltage is approximately one-half the voltage level of the sum of the upper limit of the first program state and the lower limit of the second program state (½(Vt0H+Vt1L)) or of from approximately +2.0V to approximately +4.0V. In general for a multiple level programming, the read voltage level is optimized to be one-half of the voltage of the sum of the upper limit of the lower program state added to the lower limit of the next higher program state.

The word line controller applies a pass voltage level to the word line of the charge retaining transistors connected to the selected charge retaining transistors to connect the selected charge retaining transistors to the local bit line or local source line. The pass voltage level is approximately +1.0V greater than the voltage level of the upper limit of the largest threshold voltage level.

The column voltage control circuit applies a read biasing voltage of approximately 1.0V to the global metal bit lines and thus to the local metal bit lines of the selected column pairs of charge retaining transistors. The column voltage control circuits applies the ground reference voltage level to the global metal source lines and thus to the local metal source lines of the selected NOR flash memory cells. The sense amplifier connected to the global metal bit lines and thus to the local metal bit lines to detect whether the threshold voltage level of selected page of charge retaining transistors have their voltage threshold greater than or less than a read voltage level to determine the program state retained within the charge retaining transistors. In the case of the charge retaining transistor being programmed with more than two data states there are multiple read voltage levels to determine which of the multiple programmed data states is programmed to the charge retaining transistors.

BRIEF DESCRIPTION OF THE DRAWINGS

FIG. 6a is a table illustrating a comparison of the phenomena employed for programming and erasing dual floating gate transistor NOR flash memory cells embodying the principles of the present invention as compared with the ETOX floating gate transistor of the prior art.

FIG. 6b is a table illustrating the voltage conditions applied to an array of dual floating gate transistor NOR flash memory cells having single level programmed to cells (SLC) and multiple level programmed cells (MLC) for erase, over-erase, and program verification embodying the principles of the present invention.

FIG. 6c is a table illustrating the voltage conditions applied to an array of dual floating gate transistor NOR flash memory cells having single level programmed cells (SLC) and multiple level programmed cells (MLC) for reading embodying the principles of the present invention.

FIG. 9 is a table illustrating the voltage conditions for operating an array of an array of dual floating gate transistor NOR flash memory cell having single level programmed cells (SLC) embodying the principles of the present invention.

DETAILED DESCRIPTION OF THE INVENTION

As described above, over-erasure occurs if, during the erasing step, too many electrons are removed from the floating gate leaving a slight positive charge. This biases the dual floating gate transistor NOR flash memory cell to be conducting such that a current may leak through the dual floating gate transistor NOR flash memory cell even when it is not addressed. To eliminate over-erasing in an array of the NAND-like dual charge retaining transistor NOR flash memory cells, erasure of a block of dual charge retaining (charge storage in a floating gate or charge trapping in a SONOS (silicon-oxide-nitride-oxide silicon)) NOR flash memory cells begins by selecting a first half block of alternating pages of charge retaining transistors. A block of the array of dual charge retaining transistor NOR flash memory cells has two half blocks where each half blocks includes the pages of alternating rows of the dual charge retaining transistor NOR flash memory cells. The dual charge retaining transistor NOR flash memory cells of the first half block are simultaneously and collectively erased. The erase is then verified page by page to ensure that the first half block of charge retaining transistors have their voltage threshold levels less than the upper limit of a first program state. If any of the charge retaining transistors of the first half block have their threshold voltage level greater than the upper limit of the first program state, the half block of charge retaining transistors is erased and verified page by page repetitively until all the charge retaining transistor have their threshold voltage levels less than the upper limit of the first program state. The first half block of charge retaining transistors is then over-erase verified page by page to ensure that the threshold voltage level of the charge retaining transistors is greater than a lower limit of the first program state. If any of the charge retaining transistors has their threshold voltage levels less than a lower limit of the first program state, those charge retaining transistors are then programmed and over-erase verified to bring their threshold voltage levels to be greater than the lower limit of the first program state.

Upon completion of erasure of the first half block of charge retaining transistors, the second half block is selected and the half block of charge retaining transistors is erased, erased verified, over-erase verified, and programmed until the charge retaining transistors of the second half block have their threshold voltages between the lower limit of the first program state and the upper limit of the first program state.

Figure 1A:
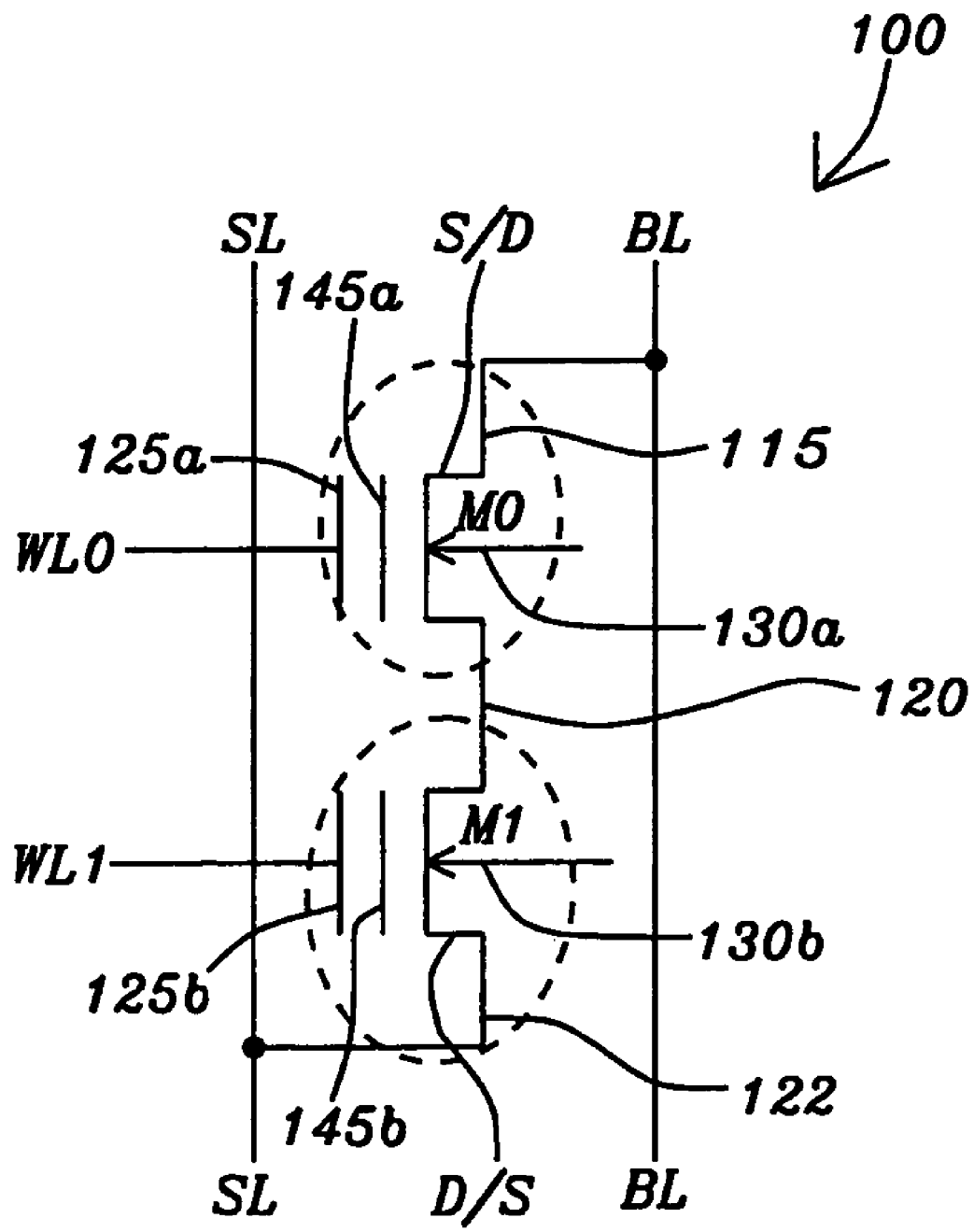
FIG. 1a is schematic diagram of an embodiment of dual floating gate transistor NOR flash memory cell embodying the principles of the present invention.
Figures 1, 1B, 2:
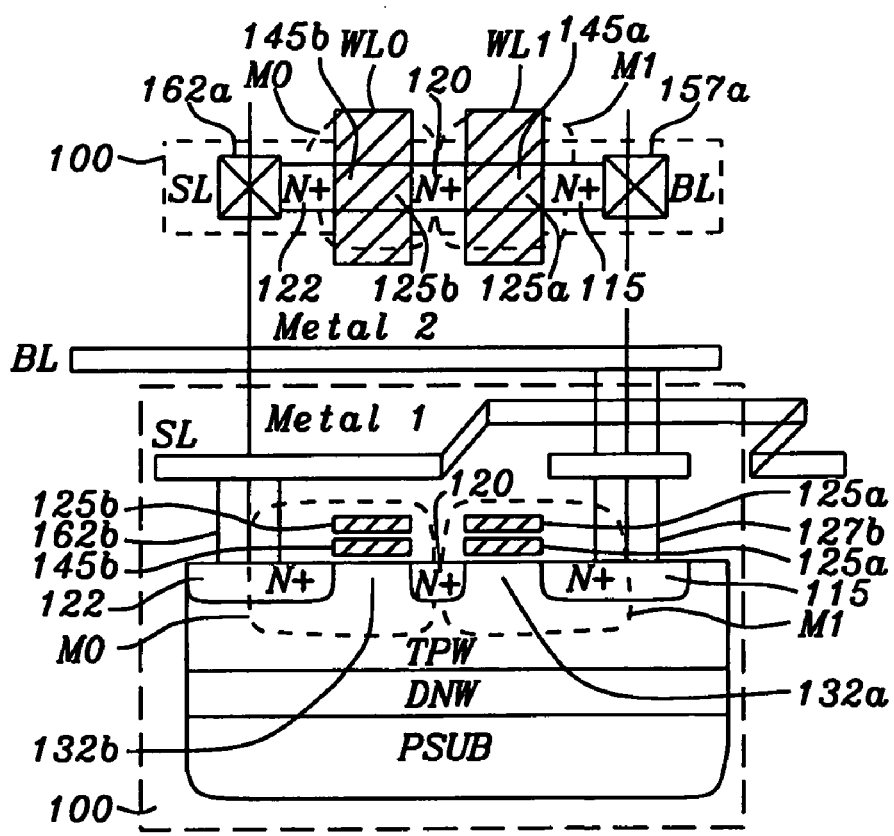
FIGS. 1b-1. 1b-2, 1c-1 and 1c-2 are top plan views and cross sectional cross sectional views of an embodiment of dual floating gate transistor NOR flash memory cell embodying the principles of the present invention.
Figures 1, 1C, 2:
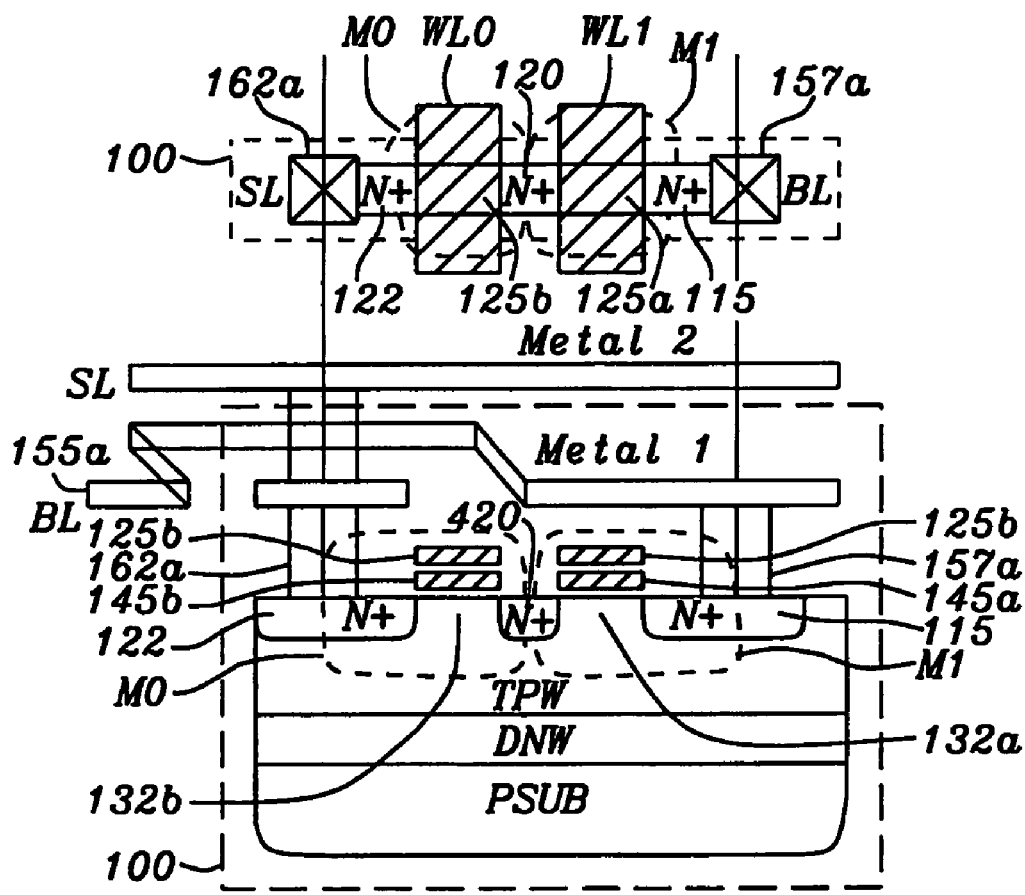

FIG. 1*a* is the schematic diagram of a NAND-like dual floating gate transistor NOR flash memory cell 100 embodying the principles of the present invention. FIGS. 1*b*-1 and 1*c*-1 are top plan views of implementations of a dual floating gate transistor NOR flash memory cell 100 embodying the principles of the present invention. FIGS. 1*b*-2 and 1*c*-2 are a cross sectional views of implementations of a dual floating gate transistor NOR flash memory cell 100 embodying the principles of the present invention. The dual floating gate transistor NOR flash cell 100 is formed in the top surface of a P-type substrate p-SUB. An N-type material is diffused into the surface of the P-type substrate p-SUB to form a deep n-type diffusion well DNW. A P-type material is then diffused into the surface of the deep n-type diffusion well DNW to form a shallow p-type diffusion well TPW (commonly referred to as a triple P-well). The N-type material is then diffused into the surface of the shallow p-type diffusion well TPW to form the source/drain region (D) 115*a* of the floating gate transistor M0, the source/drain region of the floating gate transistor M1 and the common source/drain (S/D) 120. The common source/drain 120 being the source region of the floating gate transistor M0 and the drain of the floating gate transistors M1. A first polycrystalline silicon layer is formed above the bulk region of the shallow p-type diffusion well TPW between the source/drain region 115*a* and the common source/drain region 120 floating gate transistor M0 and the common source/drain region 120 and the source/drain region 122 of the floating gate transistor M1 to form the floating gates 145*a* and 145*b*. A second polycrystalline silicon layer is formed over the floating gates 145*a* and 145*b* to create the control gates (G) 125*a* and 125*b* of the floating gate transistors M0 and M1. The common source/drain region 120 is formed as self-aligned between the two adjacent second polycrystalline silicon layers of two control gates 125*a* and 125*b* of floating gate transistors M0 and M1. The common source/drain 120 is used in the floating gate transistors M0 and M1 to reduce the source line pitch.

The gate length of the floating gate transistors M0 and M1 is the channel region in the bulk region of shallow P-type well TPW between source/drain region 115 and the common source/drain region 120 of the floating gate transistor M0 and the common source/drain region 120 and the source/drain region 122 of the floating gate transistors. The NOR floating gate transistor's 110 channel width is determined by the width of the N-diffusion of the source/drain region 115, the source/drain region 122 and the common source/drain region 120. The typical unit size of the dual floating gate transistor NOR flash memory cell 100 is from approximately $12\lambda^2$ to approximately $1\lambda^2$. Therefore the effective size for a single bit NOR cell is approximately $6\lambda^2$. The effective size ($6\lambda^2$) of a single bit NOR cell is slightly larger than a NAND cell size of the prior art. However, the effective size of a single bit NOR cell is much smaller than the NOR cell size ($10\lambda^2$) of the prior art for a semiconductor is manufacturing process above 50 nm. The NOR cell structure of the prior art is projected to increase to $15\lambda^2$ due to the scalability issues in semiconductor manufacturing process below 50 nm. The effective single bit/single transistor size of the dual floating gate transistor NOR flash memory cell 100 remains constant an effective cell size of approximately $6\lambda^2$. The constant cell size is a result of the scalability is identical to that of the NAND flash memory cell of the prior art.

The floating gate layers 145*a* and 145*b* each respectively store electron charges to modify the threshold voltage of the floating gate transistors M0 and M1. In all operations such as read, program and erase, the P-type substrate p-SUB is always connected to a ground reference voltage source (GND). The deep n-type diffusion well DNW is connected to the power supply voltage source (VDD) in read and program operations but is connected to a very large erase voltage level of approximately +20V in a Fowler-Nordheim channel erase operation. The shallow P-type well TPW is connected to the ground reference voltage in normal read and program operations but is connected to a very large erase voltage level of approximately +20.0V in Fowler Nordheim channel erase operation. The deep n-type p-well DNW and the shallow p-type diffusion well TPW are biased to the very large erase voltage level to avoid the undesired forward current. In present designs of dual floating gate transistor NOR flash memory cell 100, the power supply voltage source is either 1.8V or 3.0V.

In an array of dual floating gate transistor NOR flash memory cells 100, the floating gate transistors M0 and M1 are arranged in rows and columns. The second polycrystalline silicon layer 125 that is the control gate of the floating gate transistors M0 and M1 and is extended to form a word-line WL that connects to each of the floating gate transistors M0 and M1 on a row of the array. The drain/source 115 of the floating gate transistors M0 and M1 is connected to a bit line BL through the metal vias 157a and 157b. The source/drain 122 of the floating gate transistor M1 is connected to a source line SL through the metal vias 162a and 162b. The bit line BL and the source line SL being formed in parallel and in parallel with a column of the floating gate transistors M0 and M1

A tunnel oxide is formed on top of the channel region 132a and 132b between the source/drain region 115 and the common source/drain region 120 of the floating gate transistor M0 and between the common source/drain region 120 and the source/drain region 122 of the floating gate transistor M1 and beneath the floating gates 145a and 145b. The thickness of the tunnel oxide is typically 100. The tunnel oxide is the layer through which the electron charges pass during the Fowler-Nordheim channel tunneling programming and erasing. During a programming operation, the Fowler-Nordheim tunnel programming attracts stored electrons to the floating gates 145a and 145b through the tunnel oxide from the cell's channel regions 132a and 132b into the shallow p-type diffusion well TPW. During an erasing operation, the Fowler-Nordheim tunnel erasing expels stored electrons from the floating gates 145a and 145b through the tunnel oxide to cell's channel regions 132a and 132b into the shallow p-type diffusion well TPW.

After an erase operation, fewer electron charges are stored in the floating gates 145a and 145b that results in a decrease in a first threshold voltage level (Vt0) of the floating gate transistors M0 and M1. In contrast, in a Fowler-Nordheim program operation, electrons are attracted into floating gates 145a and 145b so that a second threshold voltage level (Vt1) of the floating gate transistors M0 and M1 is set to the relatively high voltage.

Figure 2A:
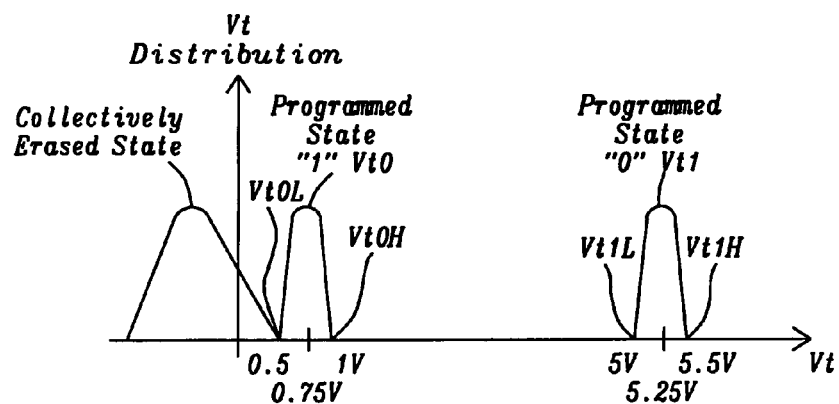
FIGS. 2a and 2b are graphs of threshold voltage levels for a various embodiments of the dual floating gate transistor NOR flash memory cell embodying the principles of the present invention.

Refer now to FIG. 2a for a discussion of the threshold voltage levels for a single level programming of the dual floating gate transistor NOR flash memory cell 100 embodying the principles of this invention. The collectively erased state illustrates the distribution of the two floating gate transistors M0 and M1 that have their threshold voltage levels reduced to a voltage level less than a lower limit of a first programmed state Vt0L or approximately +0.5V. If the two floating gate transistors M0 and M1 have their threshold voltage in this region, they may be in a marginally conductive state during a read operation to cause corruption of the data during a read operation due to the leakage current. To prevent this, the two floating gate transistors M0 and M1 have two positive programmed states (Vt0 for the first program state "1" and Vt1 for the second programmed state "0"). The first programmed state Vt0 that is nominally +0.75V with a lower limit VTOL of approximately +0V and an upper limit Vt0H of approximately +1.0V and a second programmed state Vt1 that is nominally +5.25V with a lower limit VT1L of approximately +5.0V and an upper limit Vt1H of approximately +5.5V. A selected one of the two floating gate transistors M0 and M1 is first erased to a threshold voltage level less than the upper limit of a first programmed state Vt0H. The selected one of the two floating gate transistors M0 and M1 is erase verified that it has achieved the threshold voltage level less than the upper limit Vt0H of the first program state. The selected one of the two floating gate transistors M0 and M1 is then over-erase verified that its threshold voltage is greater than the lower limit of the first programmed state Vt0L. If the threshold voltage is less than the lower limit of the first programmed state Vt0L, the selected one of the two floating gate transistors M0 and M1 is then programmed to bring the threshold voltage level to be greater than the lower limit of the first programmed state Vt0L. After the programming, the selected one of the two floating gate transistors M0 and M1, it is again over-erase verified to ensure that the threshold voltage level of the selected one of the two floating gate transistors M0 and M1 is greater than the lower limit Vt0L of the first program state.

When the selected one of the two floating gate transistors M0 and M1 is to be programmed, the selected floating gate transistor M0 or M1 is first erased as described and then reprogrammed to be within the lower Vt0L and upper Vt0H limits of the first programmed state Vt0. If the selected one of the two floating gate transistor M0 or M1 is to be programmed to a second programmed state Vt1, the selected floating gate transistor M0 or M1 is programmed to the second programmed state Vt1. The selected floating gate transistor M0 or M1 is then program verified that its threshold voltage level is greater than the lower limit of the second programmed state Vt1L.

Figure 2B:
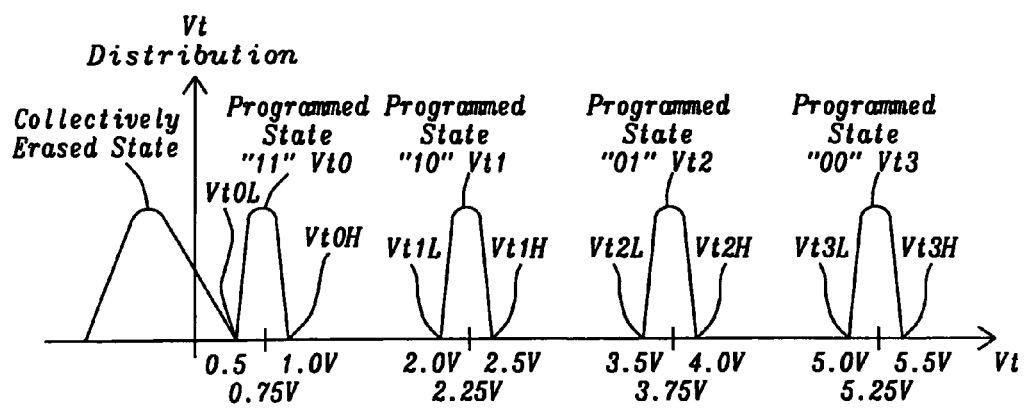

Refer now to FIG. 2b for a discussion of the threshold voltage levels for a multiple level programming of the NAND-like dual floating gate transistor NOR flash memory cell 100 embodying the principles of this invention. As described for the single level programming of FIG. 2a, the collectively erased state illustrates the distribution of the two floating gate transistors M0 and M1 that have their threshold voltage levels reduced to a voltage level less than a lower limit of a first programmed state Vt0L or approximately +0.5V. If the two floating gate transistors M0 and M1 have their threshold voltage in this region, they may be in a conductive state during a read operation to cause corruption of the data during a read operation due to the leakage current. To prevent this, the two floating gate transistors M0 and M1 have multiple programmed states as opposed to a single erased state and multiple programmed states with one less state than for this invention. In this example, the first programmed state Vt0 is nominally +0.75V with a lower limit VTOL of approximately +0.5V and an upper limit Vt0H of approximately +1.0V. A second programmed state Vt1 is nominally +2.25V with a lower limit VT1L of approximately +2.0V and an upper limit Vt1H of approximately +2.5V. A third programmed state Vt2 is nominally +3.75V with a lower limit VT2L of approximately +3.5V and an upper limit Vt2H of approximately +4.0V. A fourth programmed state Vt3 is nominally +5.25V with a lower limit VT3L of approximately +5.0V and an upper limit Vt1H of approximately +5.5V. It should be noted that the four programmed states provide for a two bit encoded data to be stored in each of the two floating gate transistors M0 and M1. It is in keeping with this invention that any bit encoding is possible within the two floating gate transistors M0 and M1 and that the two bit encoding shown is exemplary.

In operation, a selected one of the two floating gate transistors M0 and M1 is first erased to a threshold voltage level less than the upper limit of a first programmed state Vt0H. The selected one of the two floating gate transistors M0 and M1 is erase verified that it has achieved the threshold voltage level less than the upper limit Vt0H of the first program state. The selected one of the two floating gate transistors M0 and M1 is then verified that its threshold voltage is greater than the lower limit of the first programmed state Vt0L. If the threshold voltage is less than the lower limit of the first programmed state Vt0L, the selected one of the two floating gate transistors M0 and M1 is then programmed to bring the threshold voltage level to be greater than the lower limit of the first programmed state Vt0L. After the programming, the selected one of the two floating gate transistors M0 and M1, it is again over-erase verified to ensure that the threshold voltage level of the selected one of the two floating gate transistors M0 and M1 is greater than the lower limit Vt0L of the first program state.

When the selected one of the two floating gate transistors M0 and M1 is to is be programmed, the selected floating gate transistor M0 or M1 is first erased as described and then reprogrammed to be within the lower Vt0L and upper Vt0H limits of the first programmed state Vt0. If the selected floating gate transistor M0 or M1 is to be programmed to a one of the other programmed states Vt1, Vt2, or Vt3, the selected floating gate transistor M0 or M1 is programmed to the selected programmed state Vt1, Vt2, or Vt3. The selected floating gate transistor M0 or M1 is then program verified that its threshold voltage level is greater than the lower limit of the selected program state Vt1, Vt2, or Vt3.

Figure 3:
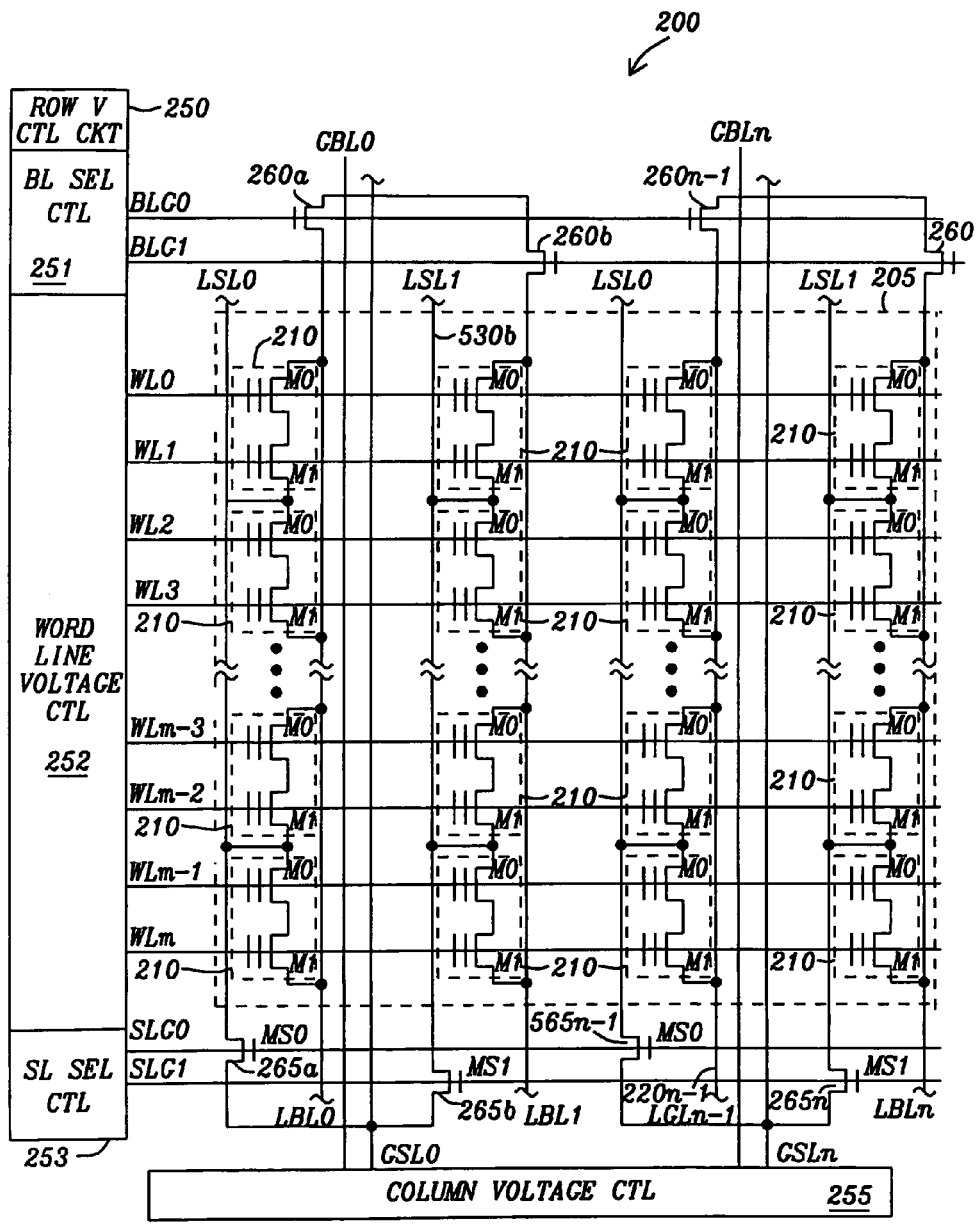
FIG. 3 is a schematic diagram of a NOR flash nonvolatile memory device incorporating various embodiments of the dual floating gate transistor NOR flash memory cell of the present invention.

FIG. 3 is a schematic diagram of a NOR flash nonvolatile memory device 200 incorporating the NAND-like dual floating gate transistor NOR flash cell 210 embodying the principles of the present invention. The NOR flash nonvolatile memory device 200 includes an array 205 of dual floating gate transistor NOR flash cells 210 arranged in a matrix of rows and columns. Each of the dual floating gate transistor NOR flash cells 210 includes two floating gate transistors M0 and M1. The two floating gate transistors M0 and M1 are structured and operate as the floating gate transistors M0 and M1 described above in FIGS. 1a, 1b-1, 1b-2, 1c-1, and 1c-2. The drain of the floating gate transistor M0 is connected to one of the local metal bit lines LBL0, LBL1, . . . , LBLn−1, and LBLn. The source of the floating gate transistor M1 is connected of one of the local metal source lines LSL0, LSL1, . . . , LSLn−1, and LSLn. The source of the floating gate transistor M0 is connected to the drain of the NOR floating gate transistor M1. Each of local bit lines LBL0, LBL1, . . . , LBLn−1, and LBLn and local source lines LSL0, LSL1, . . . , LSLn−1, and LSLn are arranged in parallel with a column of the array 205 of dual floating gate transistor NOR flash cells 210, The local bit lines LBL0, LBL1, . . . , LBLn−1, and LBLn and the local source lines LSL0, LSL1, . . . , LSLn−1, and LSLn are connected to the dual floating gate transistor NOR flash cells 210 such that the dual floating gate transistor NOR flash cells 210 are symmetrical. The local bit lines LBL0, LBL1, . . . , LBLn−1, and LBLn and the local source lines LSL0, LSL1, . . . , LSLn−1, and LSLn may be biased interchangeably to operate the array 205 of dual floating gate transistor NOR flash cells 210.

The local metal bit lines LBL0, LBL1, . . . , LBLn−1, and LBLn associated is with adjacent columns of the dual floating gate transistor NOR flash cells 210 are connected through the bit line select transistors 260a, . . . , 260n to the global metal bit lines GBL0, . . . , GBLn. The local metal source lines LSL0, LSL1, . . . , LSLn−1, and LSLn associated with adjacent columns of the dual floating gate transistor NOR flash cells 210 are connected through the source line select transistors 265a, . . . , 265n to the global source lines GSL0, . . . , GSLn. The global bit lines GBL0, . . . , GBLn and the global source lines GSL0, . . . , GSLn are connected to the column voltage control circuit 255. The column voltage control circuit 255 generates the appropriate voltage levels for selectively reading, programming, and erasing the dual floating gate transistor NOR flash cells 210.

Each of the control gates of the floating gate transistors M0 and M1 of the dual floating gate transistor NOR flash cells 210 on each row of the array 205 is connected to one of the word lines WL0, WL1, . . . , WLm−1, and WLm. The word lines WL0, WL1, . . . , WLm−1, and WLm are connected to the word line voltage control sub-circuit 252 in the row voltage control circuit 250.

Each of the gates of the bit line select transistors 260a, . . . , 260n is connected to the bit line select control sub-circuit 251 within the row voltage control circuit 250 to provide the bit line select signals BLG0 and BLG1 for activation of the bit line select transistors 260a, . . . , 260n to connect a selected local bit lines LBL0, LBL1, . . . , LBLn−1, and LBLn to its associated global bit line GBL0, . . . , GBLn.

Each of the gates of the source line select transistors 265a, . . . , 265n is connected to the source line select control sub-circuit 253 within the row voltage control circuit 250 to provide the source line select signals SLG0 and SLG1 for activation of the source line select transistors 265a, . . . , 265n to connect a selected local source lines LSL0, LSL1, . . . , LSLn−1, and LSLn to its associated global source line GSL0, . . . , GSLn. Each of the gates of the source line select transistors 265a, . . . , 265n is connected to the source line select control circuit 253 within the row voltage control circuit 250 to connect the local source lines LSL0, LSL1, . . . , LSLn−1, and LSLn to their associated global source lines GSL0, . . . , GSLn.

The array 205 of dual floating gate transistor NOR flash cells 210 includes at least one block (as shown) of the dual floating gate transistor NOR flash cells 210 and may have multiple blocks. The block is further divided into two half blocks. The half blocks consist of alternating pages of the two floating gate transistors M0 and M1. For each of the dual floating gate transistor NOR flash cells 210 on each row, one of the two floating gate transistors M0 or M1 is assigned to one page of the two floating gate transistors M0 and M1. Thus one of the two floating gate transistors M0 or M1 is assigned to one of the two half blocks and the other of the two floating gate transistors M0 and M1 is assigned to the other half block. Since all of the two floating gate transistors M0 and M1 are programmed to have a positive threshold voltage for all the program states, over-erase is not a concern during erase verification. In an erase operation, one of the two floating gate transistors M0 and M1 is selected for erase and the other remains programmed. The positive threshold voltage of the unselected programmed floating gate transistor M0 or M1 prevents any leakage current from the selected floating gate transistor M0 or M1. It should be noted that the floating gate transistor NOR flash cells 210 may have more than the two floating gate transistors M0 and M1. It is in keeping with the intent of this invention that the floating gate transistor NOR flash cells 210 have at least two of the floating gate transistors.

Figure 4:
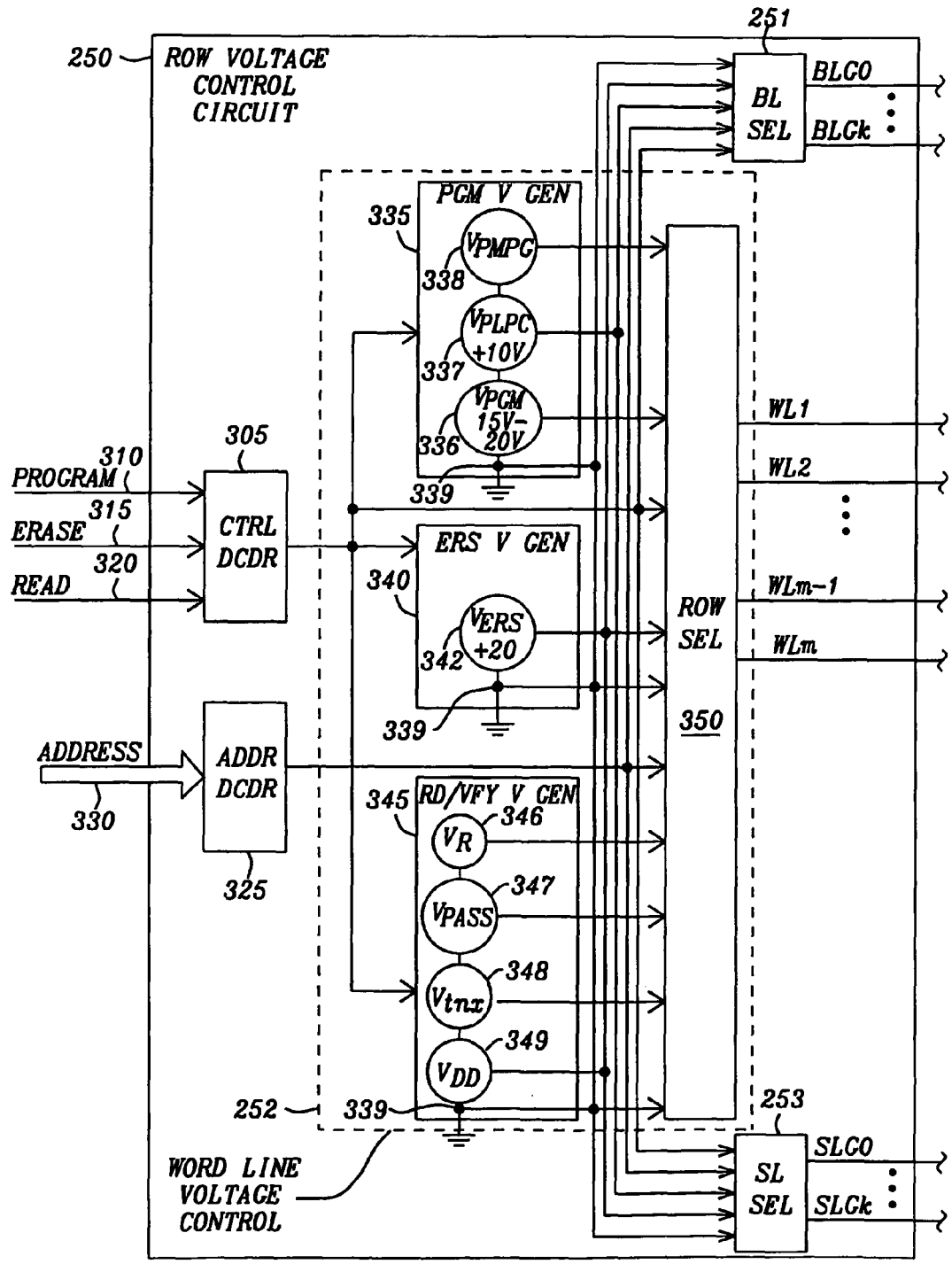
FIG. 4 is a schematic diagram of row voltage control circuit of the NOR flash nonvolatile memory device of FIG. 3 embodying the principles of the present invention.

Refer now to FIG. 4 for a description of the row voltage control circuit 250. The row voltage control circuit 250 has a control decoder 305 that receives program timing and control signals 310, erase timing and control signals 315, and read timing and control signals 320. The control decoder 305 decodes the program timing and control signals 310, erase timing and control signals 315, and read timing and control signals 320 to establish the operation of the NOR flash nonvolatile memory device 200. The row voltage control circuit 250 has an address decoder 325 that receives and decodes an address signal 330 that provides the location of the selected floating gate NOR flash cells 210 that are to be programmed, erased, or read.

The bit line select control sub-circuit 251 receives the decoded program, erase, and read timing and control signals from the control decoder 305 and the decoded addresses from the address decoder 325. The bit line select control sub-circuit 251 selects which of the bit line select signals BLG0 and BLG1 that activates the bit line select transistors 260a, . . . , 260n that connects the local bit line LBL0, LBL1, LBLn−1, and LBLn to which the selected NOR flash nonvolatile memory devices 200 are connected to the associated global bit lines GBL0, . . . , GBLn.

The source line select control sub-circuit 253 receives the decoded program, erase, and read timing and control signals from the control decoder 305 and the decoded addresses from the address decoder 325. The source line select control sub-circuit 253 selects which of the source line select signals SLG0 and SLG1 that activates the source line select transistors 265a, . . . , 265n that connects the local source lines LSL0, LSL1, . . . , LSLn−1, and LSLn to which the selected NOR flash nonvolatile memory device 200 is connected to the associated global source lines GSL0, . . . , GSLn.

The word line voltage control circuit 252 includes a program voltage generator 335, an erase voltage generator 340, a read voltage generator 345, and a row selector 350. The row voltage control circuit 250 includes the word line voltage control circuit 252 that has a row selector 350 for transferring the program, erase, and read voltages from the program voltage generator 335, the erase voltage generator 340, and the read voltage generator 345 to the selected word lines WL0, WL1, . . . , WLm−1, and WLm.

The program voltage generator 335 has a positive large program gating voltage source 336 that is connected to the row selector 350 to provide a program voltage level that is from approximately +15.0V to approximately +22.0V. The program voltage is applied to one of the selected word lines WL0, WL1, . . . , WLm−1, and WLm for setting the voltage threshold of the selected floating gate transistor M0 or M1 of FIG. 3. A positive moderate program voltage generator 338 provides a moderate program inhibit voltage level of approximately +5.0V to the row selector 350 to be applied to the unselected word lines WL0, WL1, . . . , WLm−1, and WLm for inhibiting a disturb programming of the unselected pages of the block 205 of dual floating gate transistor NOR flash cells 210. The ground reference voltage source (0.0V) 339 is transferred to the bit line select control sub-circuit 251 and source line select control sub-circuit 253 disconnecting the global bit lines GBL0, . . . , GBLn from the local bit line LBL0, LBL1, . . . , LBLn−1, and LBLn and the global source lines GSL0, . . . , GSLn from the local source lines LSL0, LSL1, . . . , LSLn−1, and LSLn to inhibit unselected local bit line LBL0, LBL1, . . . , LBLn−1, and LBLn and local source lines LSL0, LSL1, . . . , LSLn−1, and LSLn from the programming voltages. The positive large program gating voltage generator 337 generates the positive large program gating voltage of approximately +10.0V that is transferred to the bit line select control sub-circuit 251 and source line select control sub-circuit 253 for connecting global bit lines GBL0, . . . , GBLn to the local bit line LBL0, LBL1, . . . , LBLn−1, and LBLn and the global source lines GSL0, . . . , GSLn and the local source lines LSL0, LSL1, . . . , LSLn−1, and LSLn for providing the programming voltage level of the ground reference voltage level (0.0V) to the selected floating gate transistors M0 and M1 or the large program inhibit voltage level of approximately +10.0V to the unselected floating gate transistors M0 and M1.

The erase voltage generator 340 has a very large positive erase inhibit voltage generator 342 that is connected to the row selector 350 to provide the necessary very large positive erase inhibit voltage of from approximately +18.0V to approximately +22.0V (nominally +20.0V) to the word lines WL0, WL1, . . . , WLm−1, and WLm of the unselected pages of the NOR flash nonvolatile memory device 200 to prevent erasing of the unselected floating gate transistors M0 and M1. The erase voltage generator 340 is also connected to the bit line select control sub-circuit 251 and source line select control sub-circuit 253 for providing the very large positive erase select voltage to connect global bit lines GBL0, . . . , GBLn to the local bit line LBL0, LBL1, . . . , LBLn−1, and LBLn and the global source lines GSL0, . . . , GSLn and the local source lines LSL0, LSL1, . . . , LSLn−1, and LSLn. During an erase operation, the global to source lines GSL0, . . . , GSLn are floating. The very large erase voltage being applied to the shallow p-type well TPW causes the drains and sources of the floating gate transistors M0 and M1 to be coupled to the very large positive erase voltage. The ground reference voltage source (0.0V) 339 is transferred to the row control circuit to be applied to the selected word lines WL0, WL1, . . . , WLm−1, and WLm to create the erase voltage field from the control gate to the channel region of the selected floating gate transistors M0 and M1.

It should be noted that the shallow p-type diffusion well TPW is shared by all floating gate transistors M0 and M1 and the bit line select transistors 260a, . . . , 260n and the source line select transistors 265a, . . . , 265n. With the very large erase voltage being applied to the shallow p-type well TPW, the bit line select transistors 260a, . . . , 260n and the source line select transistors 265a, . . . , 265n have the very large erase voltage applied to their bulk region. The bit line select transistors 260a, . . . , 260n and the source line select transistors 265a, . . . , 265n are single polycrystalline silicon relatively high voltage transistors. However with the very large erase voltage applied to their bulk, the bit line select transistors 260a, . . . , 260n and the source line select transistors 265a, . . . , 265n would be subject to gate breakdown during an erase. To prevent the gate breakdown, the very large positive erase select voltage of from approximately +18.0V to approximately +22.0V (nominally +20.0V) is applied to the gates of the bit line select transistors 260a, . . . , 260n and the source line select transistors 265a, . . . , 265n.

The read voltage generator 345 has a read voltage generator 346 to provide the necessary read reference voltage $V_R$ to the control gates of the selected word line of the floating gate transistors M0 and M1 of FIG. 3 for reading single level and multiple level cell data. The read voltage generator 345 has read pass voltage generator 347 to provide the read pass voltage to the control gate of the unselected control gates of floating gate transistors M0 and M1 of FIG. 3 and the threshold limit voltage generator 348 to provide the threshold read voltages Vtnx to the selected control gates of the floating gate transistors M0 and M1 of FIG. 3 for verifying the erasing, over-erasing, and programming of the floating gate transistors M0 and M1. The read voltage generator 345 provides a power supply voltage source generator 349 and the ground reference voltage level to the gates of the bit line select transistors 260a, . . . , 260n and source line select transistors 265a, . . . , 265n for connecting the to connect global bit lines GBL0, . . . , GBLn to the local bit line LBL0, LBL1, . . . , LBLn−1, and LBLn and the global source lines GSL0, . . . , GSLn and the local source lines LSL0, LSL1, . . . , LSLn−1, and LSLn in a read or verify operation. The read voltage generator 345 provides the ground reference voltage level to the control gates of the unselected control gates of floating gate transistors M0 and M1 of FIG. 3.

Figure 5:
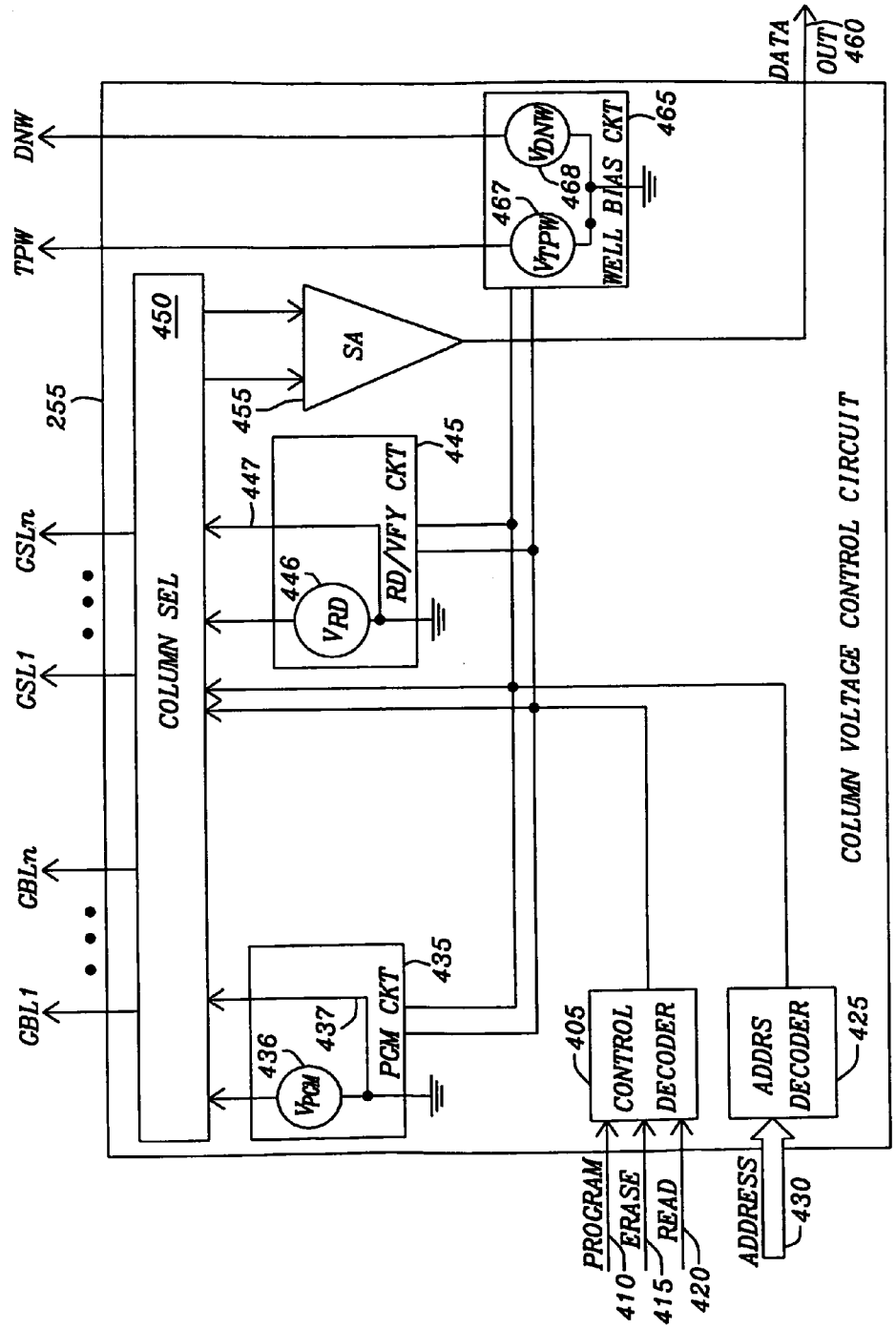
FIG. 5 is a schematic diagram of column voltage control circuit of the NOR flash nonvolatile memory device of FIG. 3 embodying the principles of the present invention.

Refer now to FIG. 5 for a description of the column voltage control circuit 255. The column voltage control circuit 255 has a control decoder 405 that receives program timing and control signals 410, erase timing and control signals 415, and read timing and control signals 420. The control decoder 405 decodes the program timing and control signals 410, erase timing and control signals 415, and read timing and control signals 420 to establish the operation of the NOR flash nonvolatile memory device 200 of FIG. 3. The column voltage control circuit 255 has an address decoder 425 that receives and decodes an address signal 430 that provides the locations of the selected floating gate cell 210 that are to be programmed, erased, or read.

The column voltage control circuit 255 includes a program voltage generator 435, a read voltage generator 445, and a column selector 450. The program voltage generator 435 has a program voltage source 436 that provides a program inhibit voltage of approximately +10.0V to the drains and sources of the unselected floating gate transistors M0 and M1 of FIG. 3 inhibit programming of the unselected floating gate transistors M0 and M1. A ground reference voltage level 437 is provided to drain and source of the selected floating gate transistors M0 and M1 of FIG. 3 during the program operation to establish the voltage field between the floating gate and the sources and drains of the selected floating gate transistors M0 and M1 for programming the selected floating gate transistors M0 and M1.

During the erase operation of this invention, the sources and drains of the floating gate transistors M0 and M1 are coupled to the very large positive erase voltage from the shallow p-type diffusion well. The global bit lines GBL0, ..., GBLn and the global source lines GSL0, ..., GSLn are disconnected within the column selector 450 and allowed to float.

The read voltage generator 445 has a read bias voltage source 446 to provide the necessary read bias voltage of approximately 1.0V to the global bit lines GBL0, ..., GBLn and thus to the drain/source of the selected of the floating gate transistors M0 and M1 of FIG. 3 for reading the data state of the selected floating gate transistors M0 and M1. The read voltage generator also provides the ground reference voltage level 447 to the global source lines GSL0, ..., GSLn and thus to the source/drains of the selected floating gate transistors M0 and M1 In the read operation, the global bit lines GBL0, ..., GBLn are connected to the sense amplifier 455 by the column selector 455 to determine the data state of the selected floating gate transistors M0 and M1. The sense amplifier conditions the data state of the selected floating gate transistors M0 and M1 to generate the data output 460 for transfer to external circuitry (not shown).

The column selector 450 provides the select switching for transferring the program, erase (floating), and read voltages from the program voltage generator 435 and the read voltage generator 445 to the selected global bit lines GBL0, ..., GBLn and selected global source lines GSL0, ..., GSLn.

The column voltage control circuit 255 has a well bias control circuit 465 that includes a shallow well voltage generator 467 and a deep well voltage generator 468. The deep well generator 468 is connected to a deep n-type diffusion well DNW. The shallow p-type diffusion well TPW is connected to the shallow well voltage generator 467. The deep well voltage generator 468 generates a voltage level of the power supply voltage source for programming, verification, and reading of the array 200 of NOR flash memory cells 210 and generates a very large erase voltage for erasing a selected block 205 or page 215 of the array 200 of NOR flash memory cells 210. The shallow well voltage generator 467 transfers the voltage level of the ground reference voltage source (0.0V) for programming, verification, and reading of the array 200 of NOR flash memory cells 210. The shallow well voltage generator 467 generates the very large erase voltage level that is applied to the shallow p-type well TPW to attract the charges from the floating gate of the selected floating gate transistors M0 or M1. The very large erase voltage that is generated by the deep well generator 468 and the shallow well generator 467 prevent undesired forward currents between the deep n-type diffusion well DNW and the shallow p-type diffusion well TPW.

FIG. 6a is a table illustrating a comparison of the phenomena employed for programming and erasing dual floating gate transistor NOR flash memory cells embodying the principles of the present invention as compared with the ETOX floating gate transistor of the prior art. "Intel StrataFlash™ Memory Technology Overview", Atwood, et al., Intel Technology Journal, Vol. 1, Issue 2, Q4 1997, found www.intel.com, Apr. 23, 2007, "Intel StrataFlash™ Memory Technology Development and Implementation", Fazio, et al., Intel Technology Journal, Vol. 1, Issue 2, Q4 1997, found www.intel.com, Apr. 21, 2009, "ETOX™ Flash Memory Technology: Scaling and Integration Challenges", Fazio, et al., Intel Technology Journal, Vol. 6, Issue 2, May 2002, found www.intel.com, Apr. 21, 2009, discuss a floating gate ETOX™ flash memory transistor. The ETOX™ (Erase through oxide) emphasizes the transition from the UV-erasing to electrical erasing. The ETOX closely resembles the structure of an Electrically Programmable Read Only Memory (EPROM) having a MOS transistor with a floating gate. In the case of the ETOX memory cell, the oxide between floating gate and the channel has been thinned to allow the flow of charge for programming and erasing.

In the ETOX floating gate transistor, the programming generally employs a channel hot electron injection phenomena for programming and a Fowler Nordheim tunneling phenomena for erasing the device. Generally, the source line structure of the ETOX floating gate transistor has a common source line for running parallel with the rows of an array of the ETOX floating gate transistors.

In contrast the floating gate transistors embodying the principles of this invention employ the low-current Fowler Nordheim tunneling phenomena for programming and erasing. The Fowler Nordheim tunneling phenomena requires only approximately 1 nA of current to perform the program or erase operation as opposed to 100 µA for the channel hot electron injection phenomena. The structure of the dual floating gate NOR flash nonvolatile memory device of this invention has the metal source line structure of the array in parallel with the metal bit lines.

FIG. 6b is a table illustrating the voltage conditions applied to an array of dual floating gate transistor NOR flash memory cells having single level programmed is cells (SLC) and multiple level programmed cells (MLC) for erase verification, over-erase verification, and program verification embodying the principles of the present invention. Referring back to FIG. 3, a row of the floating gate transistors M0 or M1 is designated as a page 215 within the block 205 of the array 200 of the dual floating gate transistor NOR flash memory cells 210. The word line voltage control circuit 252 applies the verification voltage $V_{VFY}$ to the word line WL0 of the selected page 215. Within each of the dual floating gate transistor NOR flash memory cells 210, the floating gate transistor M1 connected to each of the floating gate transistors M0 of the selected page functions as a pass gate and must be turned on so as to connect the selected floating gate transistor M0 to the local source lines LSL0, LSL1, ..., LSLn−1, and LSLn. It should be noted had the selected page have been the row including the floating gate transistors M1 then each of the floating gate transistors M0 would have been the pass gate and have had to be turned on to connect the to the bit line select transistors 260a, ..., 260n. The word line voltage control circuit 252 applies a pass voltage level $V_{pass}$ to the word line WL1 connected to the control gates of the unselected pass gate transistors M1 of the selected dual floating gate transistor NOR flash memory cells 210.

The column voltage control circuit 255 applies the read biasing voltage level $V_{RD}$ and connects the sense amplifier(s) 455 to the global bit lines GBL0, ..., GBLn. The bit line select control circuit 251 activates one of the bit line select signals BLG0 or BLG1 to activate the bit line select transistors 260a, ..., 260n to connect the global bit lines GBL0, ..., GBLn to one half of the local bit lines LBL0, LBL1, ..., LBLn-1, and LBLn. The column voltage control circuit 255 connects the global source lines GSL0, ..., GSLn to the ground reference voltage level. The source select control circuit 253 activates one of the source line select signals SLG0 or SLG1 to connect one half of the local source lines LSL0, LSL1, ..., LSLn−1, and LSLn to the global source lines to GSL0, ..., GSLn.

In the erase verification operation of a single programming (SLC) and multiple level programming (MLC), the pass voltage level $V_{pass}$ applied to control gates of the unselected pass gate floating gate transistors M1 is the upper limit of the highest threshold voltage level of a programmed floating gate transistor M0 and M1 plus a is differential voltage level of approximately 1.0V. The verification voltage level $V_{vfy}$, applied to the control gates of the selected floating gate transistors M0 of the selected page 215 is the voltage level of the upper limit of the first program state Vt0H. If the selected floating gate transistors M0 turn on, the selected floating gate transistors M0 are erased and if they do not turn on, they are not erased and must be erased again.

In the over-erase verification operation of a single programming (SLC) and multiple level programming (MLC), the pass voltage level $V_{pass}$ applied to control gates of the unselected pass gate floating gate transistors M1 is the upper limit of the highest threshold voltage level of a programmed floating gate transistor M0 and M1 plus a differential voltage level of approximately 1.0V. The verification voltage level $V_{vfy}$, applied to the control gates of the selected floating gate transistors M0 of the selected page 215 is the voltage level of the lower limit of the first program state Vt0L. If the selected floating gate transistors M0 do not turn on, the selected floating gate transistors M0 are not over-erased. However, if they do turn on, they are over-erased and must be re-programmed to a voltage greater than the lower limit of the first program state Vt0L.

In the program verification operation, the selected floating gate transistors M0 must be verified against the threshold voltage level for the designated program state that is programmed to the selected floating gate transistors M0 (Vt0 and Vt1 for single level program (SLC) or Vt0, Vt1, Vt2, and Vt3 for a two bit multiple level program (MLC)). For both the single programming (SLC) and the multiple level programming (MLC), the pass voltage level $V_{pass}$ applied to control gates of the unselected pass gate floating gate transistors M1 is the upper limit of the highest threshold voltage level of a programmed floating gate transistor M0 and M1 plus a differential voltage level of approximately 1.0V.

For the single level programming of the selected floating gate transistors M0, the verification operation is a two step process. In the first step, the verification voltage level $V_{vfy}$, applied to the control gates of the selected floating gate transistors M0 of the selected page 215 is the voltage level of the lower limit of the first program state Vt0L. If the selected floating gate transistors M0 do not turn on, the selected floating gate transistors M0 are programmed to the first program state. However, if they do turn on, they are over-erased and must be re-programmed to a threshold voltage level greater than the lower limit of the first program state Vt0L. In the second step, the verification voltage level $V_{vfy}$ applied to the control gates of the selected floating gate transistors M0 of the selected page 215 is the voltage level of the lower limit of the second program state Vt1L. If the selected floating gate transistors M0 do not turn on, the selected floating gate transistors M0 are programmed to the second program state. However, if they do turn on, they are not programmed to the second program state and must be re-programmed to a threshold voltage level greater than the lower limit of the first program state Vt0L.

For the multiple level programming (MLC) of the selected floating gate transistors M0, the verification operation is a multiple step process (four steps for a two bit-four program state cell). In the each step, the verification voltage level $V_{vfy}$ applied to the control gates of the selected floating gate transistors M0 of the selected page 215 is the voltage level of the lower limit of the chosen program state VtnL (n being 0, 1, 2, 3). If the selected floating gate transistors M0 do not turn on, the selected floating gate transistors M0 are programmed to the chosen program state. However, if they do turn on, they are not programmed to the chosen state and must be re-programmed to a threshold voltage level greater than the lower limit of the chosen program state VtnL. This process is repeated for each of the program iterations until the selected floating gate transistors M0 of the selected page 215 are programmed.

FIG. 6c is a table illustrating the voltage conditions applied to an array 200 of dual floating gate transistor NOR flash memory cells 210 of FIG. 3 having single level programmed cells (SLC) and multiple level programmed cells (MLC) for reading selected floating gate transistors M0 of a selected page 215.

In the read operation, the threshold voltage level of the selected floating gate transistors M0 must be evaluated to determine the designated program state that is programmed to the selected floating gate transistors M0 (Vt0 and Vt1 for single level program (SLC) or Vt0, Vt1, Vt2, and Vt3 for a two bit multiple level program (MLC)). For both the single programming and the multiple level programming the pass voltage is level $V_{pass}$ applied to control gates of the unselected pass gate floating gate transistors M1 is the high level pass voltage VH1F for a fast read and VH1S for a slow read. The pass voltage level $V_{pass}$ is set to the upper limit of the highest threshold voltage level of a programmed floating gate transistor M0 and M1 plus a differential voltage level. Thus, the pass voltage level $V_{pass}$ for the fast read (high level pass voltage VH1F) is approximately +10.0V. This causes the unselected pass gate floating gate transistors M1 to have a lower resistance insuring a more accurate and faster determination of the programmed data state. The pass voltage level $V_{pass}$ for the slow read (lower level pass voltage VH1S) is approximately +6.5V.

For the read operation of the single level programming of the selected floating gate transistors M0, the read voltage level $V_r$ is applied to the control gates of the selected floating gate transistors M0 of the selected page 215. The single program level read voltage level $V_{rSLC}$ has a voltage level that is approximately one-half the voltage level of the sum of the upper limit (Vt0H) of the first program state and the lower limit (Vt1L) of the second program state (½(Vt0H+Vt1L)) or of from approximately +2.0V to approximately +4.0V. If the selected floating gate transistors M0 do not turn on, the selected floating gate transistors M0 are programmed to the first program state. However, if they do turn on, they are programmed second program state for the single level program.

For a read operation the multiple level programming (MLC) of the selected floating gate transistors M0, the read voltage level $V_r$ applied to the control gates of the selected floating gate transistors M0 of the selected page 215. For a fast read and slow read of the selected floating gate transistors M0 the read voltage levels $V1_{rMLC}$, $V2_{rMLC}$, and $V3_{rMLC}$, are optimized to be one-half of the voltage of the sum of the upper limit of the lower program state added to the lower limit of the next higher program state (½(VtnH +Vt(n+1)L) where n is 1, 2, and 3).

The read voltage Vr applied to the control gates of the selected floating gate transistors M0 is first set first to a first read voltage level $V1_{rMLC}$ that is the midpoint between the upper limit of the first program state (Vt0H) and the lower limit of the second program state (Vt1L) to determine if the selected floating gate transistors M0 are programmed to the first program state. Then, the read voltage Vr applied to the control gates of the selected floating gate transistors M0 is set to the a second read voltage level $V2_{rMLC}$ that is the midpoint between the upper limit of the first program state (Vt1H) and the lower limit of the second program state (Vt2L) to determine if the selected floating gate transistors M0 are programmed to the second program state. Then, the read voltage Vr applied to the control gates of the selected floating gate transistors M0 is set to a third read voltage level $V3_{rMLC}$ that is the midpoint between the upper limit of the first program state (Vt2H) and the lower limit of the second program state (V31L) to determine if the selected floating gate transistors M0 are programmed to the third program state or fourth program state.

Figure 7A:
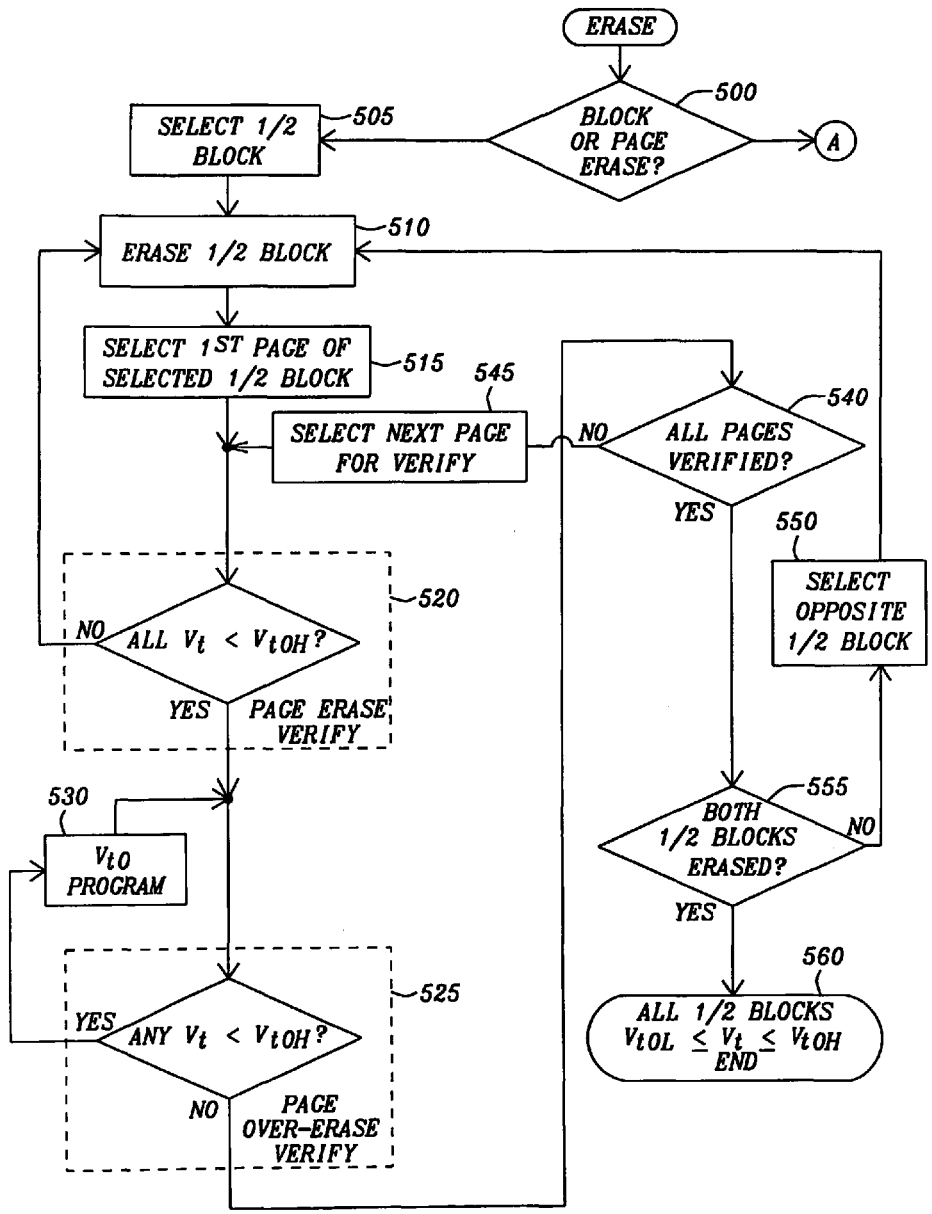
FIGS. 7a and 7b are a flowchart for performing block and page erase operations on a NOR flash nonvolatile memory device embodying the principles of the present invention.
Figure 7B:
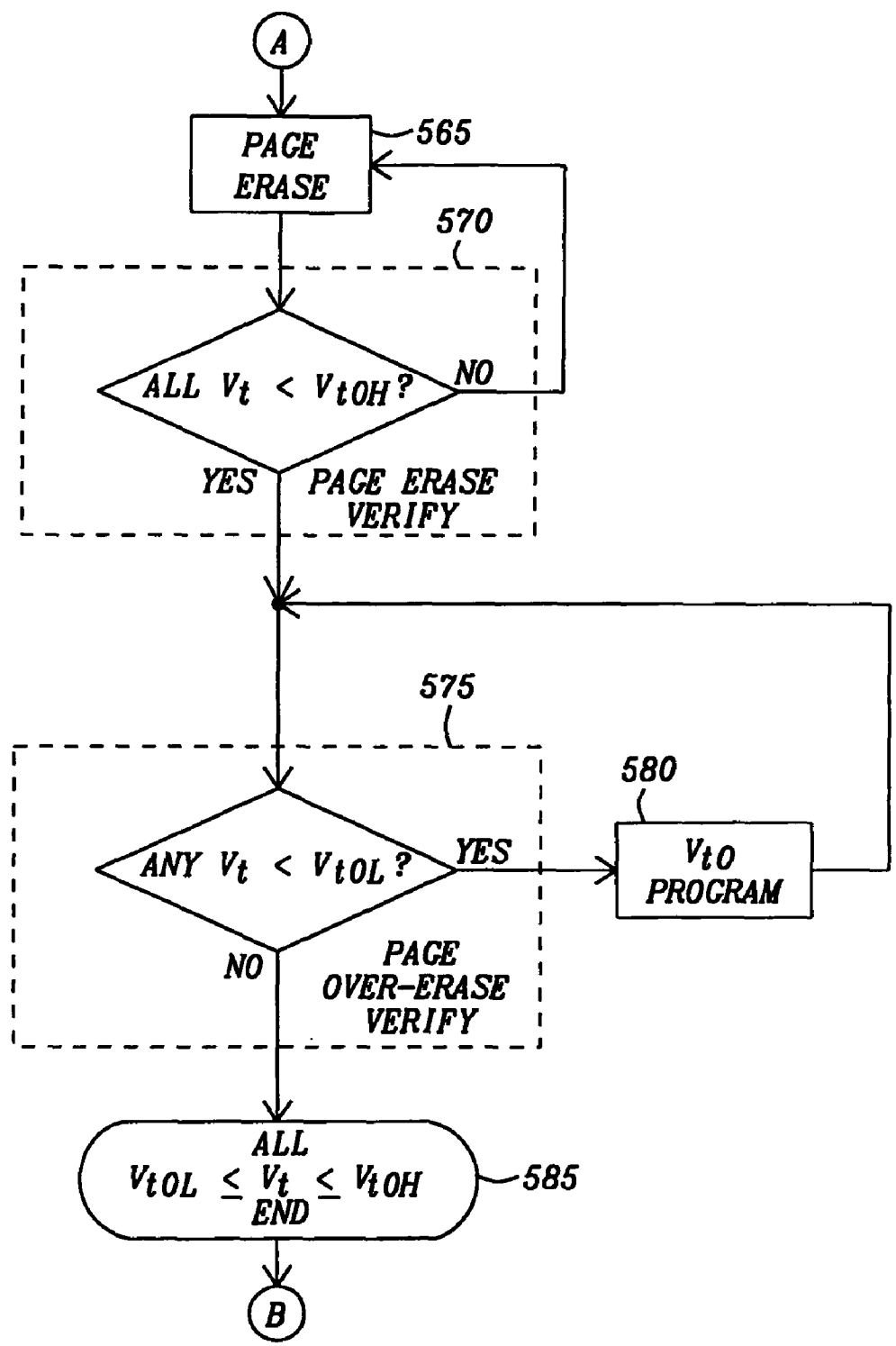

Refer now to FIGS. 3, 7a, 7b, 8a, 8b and FIG. 9 for a discussion of a method of operation of the NOR flash nonvolatile memory device 200 incorporating the dual floating gate transistor NOR flash cells 210 embodying the principles of the present invention. FIGS. 7a and 7b are a flowchart for performing block and page erase operations on a NOR flash nonvolatile memory device 200. The method of operation begins with an erase procedure. There are two basic erase procedures—a block erase or a page erase. A decision (Box 500) is made to determine the erase procedure. If the erase is to be a block erase, a first half block of alternating pages is chosen (Box 505) for erasure. The selected half block is then erased (Box 510).

Referring to FIGS. 3 and 9 of the voltage levels employed in the half block erase procedure (Box 510), the word line voltage control circuit 252 applies the very large erase inhibit voltage of from approximately +18.0V to approximately +22.0V (nominally +20.0V) to the word lines WL2, . . . , WLm−1, and WLm of the unselected to pages and to the word line WL1 of the unselected one of the two floating gate transistors M1 of the row of dual floating gate transistor NOR flash cells 210. The word line voltage control circuit 252 applies the ground reference voltage level (0.0V) to the word line WL0 of the selected floating gate transistor M0. The block select control circuit 251 and the source line select control circuit 253 apply a very large positive erase gating voltage of from approximately +18.0V to approximately +22.0V (nominally +20.0V) to the bit line select lines BLG0 and BLG1 and the source line select lines SLG0 and SLG1 to activate respectively the bit line select transistors 260a, . . . , 260n and the source line select transistors 265a, . . . , 265n. The column voltage control circuit 255 disconnects the global bit lines GBL0, . . . , GBLn and global source lines GSL0, . . . , GSLn and allowed to float. The drains and source of the floating gate transistors M0 and M1 of the selected dual floating gate transistor NOR flash cells 210 are coupled to the very large positive erase voltage to the shallow p-type diffusion well TPW. The column voltage control circuit 255 applies the very large erase voltage to the shallow p-type diffusion well TPW and the deep n-type diffusion well DNW. The voltage between the control gates and the channel region between the sources and drains of the selected half block of the floating gate transistors M0 causes a Fowler Nordheim tunneling phenomena to extract electrons from the floating gate of the selected floating gate transistors M0 and M1. The duration of the half block erase procedure is from approximately 1 msec to approximately 5 msec.

Refer back now to FIG. 7a. Upon completion of the erasing of the selected half block, the erase must be verified on a page by page basis. The verification procedure begins by selecting (Box 515) a first page of the selected half block. The selected page is verified (Box 520) that it has a threshold voltage level that is less than the upper limit of the first program state Vt0H. Refer back now to FIGS. 3 and 9 for a discussion of the erase verification. The word line voltage control circuit 252 applies the ground reference voltage level to the word lines word lines WL2, . . . , WLm−1, and WLm to inhibit a verification operation for the unselected dual floating gate transistor NOR flash cells 210. The word line voltage control circuit 252 applies the pass voltage level $V_{pass}$ to the word line WL1 connected to the unselected pass floating gate transistors M1 of the selected page of the dual floating gate transistor NOR flash cells 210. The word line voltage control circuit 252 applies an erase verification voltage level that is the voltage level of the upper limit of the first program state Vt0H.

The erase verification process (Box 520) is performed on one of two is halves of the page 215 of the selected floating gate transistors M0. The bit line select control circuit 251 activates the bit line select signals BLG0 and BLG1 to a voltage level of the power supply voltage source VDD to activate the bit line select transistors 260a, . . . , 260n to connect the selected local bit lines LBL0, LBL1, . . . , LBLn−1, and LBLn to the global bit lines GBL0, . . . , GBLn. The bit line select control circuit 251 activates the bit line select signals BLG0 and BLG1 to a voltage level of the ground reference voltage level to turnoff the bit line select transistors 260a, . . . , 260n to disconnect the unselected local bit lines LBL0, LBL1, . . . , LBLn−1, and LBLn to the global bit lines GBL0, . . . , GBLn. The column voltage control circuit 255 applies a read bias voltage level to the global bit lines GBL0, . . . , GBLn and connects the sense amplifiers to the global bit lines GBL0, . . . , GBLn. The source line select control circuit 253 activates the source line select signals SLG0 and SLG1 to a voltage level of the power supply voltage source VDD to activate the source line select transistors 265a, . . . , 265n to connect the selected local source lines LSL0, LSL1, . . . , LSLn−1, and LSLn to the global source lines GSL0, . . . , GSLn. The source line select control circuit 253 activates the source line select signals SLG0 and SLG1 to a voltage level of the ground reference voltage level to turnoff the source line select transistors 265a, . . . , 265n to disconnect the unselected local source lines LSL0, LSL1, . . . , LSLn−1, and LSLn to the global source lines GSL0, . . . , GSLn. The column voltage control circuit 255 sets the global source lines GSL0, . . . , GSLn to the ground reference voltage level to detect the program state of the selected half of the selected floating gate transistors M0.

Refer back now to FIG. 7a. At the completion of the erase verification (Box 520) of the first half of the selected page of selected floating gate transistors M0, the second half then has the erase verification procedure (Box 520) performed. When the total page 215 of the selected floating gate transistors M0 are erase verified (Box 520), the selected half block of the block 205 is then re-erased (Box 510), if any of the selected floating gate transistors M0 that have not passed the erase verification (Box 520). The erase procedure (Box 510) and erase verification procedure (Box 520) continues until the selected floating gate transistors M0 of the entire selected page 215 are erased.

Upon completion of erase verification (Box 520), the selected half block is then over-erase verified (Box 525) on a page by page basis. The selected page is over-erase verified (Box 525) to confirm that it has a threshold voltage level that is greater than the lower limit of the first program state Vt0L. Refer back now to FIGS. 3 and 9 for a discussion of the over-erase verification (Box 525). The word line voltage control circuit 252 applies the ground reference voltage level to the word lines word lines WL2, ..., WLm−1, and WLm to inhibit a verification operation for the unselected dual floating gate transistor NOR flash cells 210. The word line voltage control circuit 252 applies the pass voltage level $V_{pass}$ to the word line WL1 connected to the unselected pass floating gate transistors M1 of the selected page of the dual floating gate transistor NOR flash cells 210. The word line voltage control circuit 252 applies an over-erase verification voltage level that is the voltage level of the lower limit of the first program state Vt0L.

The over-erase verification process is performed on one of two halves of the page 215 of the selected floating gate transistors M0. The bit line select control circuit 251 activates the bit line select signals BLG0 and BLG1 to a voltage level of the power supply voltage source VDD to activate the bit line select transistors 260a, ..., 260n to connect the selected local bit lines LBL0, LBL1, ..., LBLn−1, and LBLn to the global bit lines GBL0, ..., GBLn. The bit line select control circuit 251 activates the bit line select signals BLG0 and BLG1 to a voltage level of the ground reference voltage level to turnoff the bit line select transistors 260a, ..., 260n to disconnect the unselected local bit lines LBL0, LBL1, ..., LBLn−1, and LBLn to the global bit lines GBL0, ..., GBLn. The column voltage control circuit 255 applies a read bias voltage level to the global bit lines GBL0, ..., GBLn and connects the sense amplifiers to the global bit lines GBL0, ..., GBLn. The source line select control circuit 253 activates the source line select signals SLG0 and SLG1 to a voltage level of the power supply voltage source VDD to activate the source line select transistors 265a, ..., 265n to connect the selected local source lines LSL0, LSL1, ..., LSLn−1, and LSLn to the global source lines GSL0, ..., GSLn. The source line select control circuit 253 activates the source line select signals SLG0 and SLG1 to a voltage level of the ground reference voltage level to turnoff the source line select transistors 265a, ..., 265n to disconnect the unselected local source lines LSL0, LSL1, ..., LSLn−1, and LSLn to the global source lines GSL0, ..., GSLn. The column voltage control circuit 255 sets the global source lines GSL0, GSLn to the ground reference voltage level to detect the program state of the selected half of the selected floating gate transistors M0.

Refer back now to FIG. 7a. At the completion of the first half of the selected page of selected floating gate transistors M0. The second half of the selected page of floating gate transistors M0 then has the over-erase verification procedure (Box 525) performed. When the total page 215 of the selected floating gate transistors M0 are over-erase verified (Box 520), the selected page 215 of the block 205 is then programmed (Box 530), if any of the selected floating gate transistors M0 have not passed the over-erase verification (Box 525).

In the re-programming (Box 530) of the over-erased selected floating gate transistors M0 of the selected page 215, the word line voltage control circuit 252 applies the moderate inhibit voltage level of approximately +5.0V to the word lines WL1, WL2, ..., WLm−1, and WLm to inhibit the program for the unselected dual floating gate transistor NOR flash cells 210. The word line voltage control circuit 252 applies the very large program voltage level (approximately +15.0V to approximately +22.0V) to the word line WL0 connected to the selected floating gate transistors M0 of the selected page 215. The column voltage control circuit 255 applies a programming voltage level that is approximately the ground reference voltage level or the large inhibit voltage level of selectively to the global bit lines GBL0, ..., GBLn and the global source lines GSL0, ..., GSLn for programming those selected floating gate transistors M0 that are over-erased and inhibiting programming those selected floating gate transistors M0 that are not over-erased. The bit line select voltage control sub-circuit 251 activates the bit line to select signals BLG0 and BLG1 to a voltage level of the power supply voltage source VDD or the ground reference voltage level (0.0V) to selectively activate or deactivate the bit line select transistors 260a, ..., 260n to connect the selected local bit lines LBL0, LBL1, ..., LBLn−1, and LBLn to the global bit lines GBL0, ..., GBLn for selectively applying the programming voltage level that is approximately the ground reference voltage level or the large inhibit voltage level of approximately +10.0V to the drains of the selected floating gate transistors M0. Similarly, the source line voltage control sub-circuit 253 activates the source line select signals SLG0 and SLG1 to a voltage level of the power supply voltage source VDD or the ground reference voltage level (0.0V) to selectively activate or deactivate the source line select transistors 265a, ..., 265n to connect the selected local source lines LSL0, LSL1, ..., LSLn−1, and LSLn to the global source lines GSL0, ..., GSLn for selectively applying the programming voltage level that is approximately the ground reference voltage level or the large inhibit voltage level (+10.0V) to the drains of the selected floating gate transistors M0. The shallow P-type diffusion well TPW is connected to the ground reference voltage and the deep N-type diffusion well DNW is connected to the power supply voltage source VDD. With the very large program voltage level (approximately +15.0V to approximately +20.0V), a Fowler Nordheim tunneling phenomena is triggered to attract electron charge to the floating gate of the over-erased floating gate transistors M0 to program the selected floating gate transistors M0.

Refer now back to FIG. 7a. After the programming (Box 530) of the selected page 215 of floating gate transistors M0 is complete, the selected floating gate transistors M0 of the entire selected page 215 have the over-erase verification process (Box 525) performed again. Any of the selected floating gate transistors M0 that still have their threshold voltages less than the lower limit of the first program state Vt0L are again programmed (Box 530). The over-erase verification process (Box 525) and the programming process (Box 530) continues until all the selected floating gate transistors M0 of the entire selected page 215 have their threshold voltage levels greater than the lower limit of the first program state Vt0L.

The number of selected pages is examined (Box 540) if all the pages of the selected half block is verified. If not, the next page of the selected half block is selected (Box 545) and the selected floating gate transistors M0 of the next selected page 215 are erased verified (Box 520), over-erased verified (Box 525), and if necessary reprogrammed (Box 530). This is reiterated until the entire selected half block is erased.

When it is determined (Box 540) that all the pages of the selected half block are erased, the erase status of the two half blocks is examined (Box 555). If only one of the half blocks is erased, the opposite half block is selected (Box 550). The second half block is erased (Box 510). Each page is erased verified (Box 525), over-erase verified (Box 525), and if necessary programmed (Box 530), as described above. When it is determined (Box 555) that both half blocks are erased, the block erase process ends (Box 560) and all the floating gate transistors M0 of the block 205 have their threshold voltage levels Vt programmed to be between the lower limit of the first program state Vt0L and the upper limit of the first program state Vt1L (Vt0L≦Vt≧Vt0H).

Refer now to FIG. 7b. When the decision (Box 500) to determine the erase procedure indicates that the erase is to be a page erase, the selected page 215 is erased (Box 565). The erase procedure and voltage levels are identical as those shown for the half block erase procedure (Box 510) as described above. The exception is that the only one page 215 is selected for erasure as opposed to a half block. Similarly, the selected page 215 is erased verified (Box 570), over-erase verified (Box 575), and if necessary programmed (Box 580), as described above. The erased verification procedure (Box 570), over-erase verification procedure (Box 575), and programming procedure (Box 580) are identical to the erased verification procedure (Box 525), over-erase verification procedure (Box 525), and the programming (Box 530) for the selected page 215. When all the selected floating gate transistors M0 of the selected page 215 are erased, their threshold voltage levels Vt programmed to be between the lower limit of the first program state Vt0L and the upper limit of the first program state Vt1L (Vt0L≦Vt≧Vt0H).

Figure 8A:
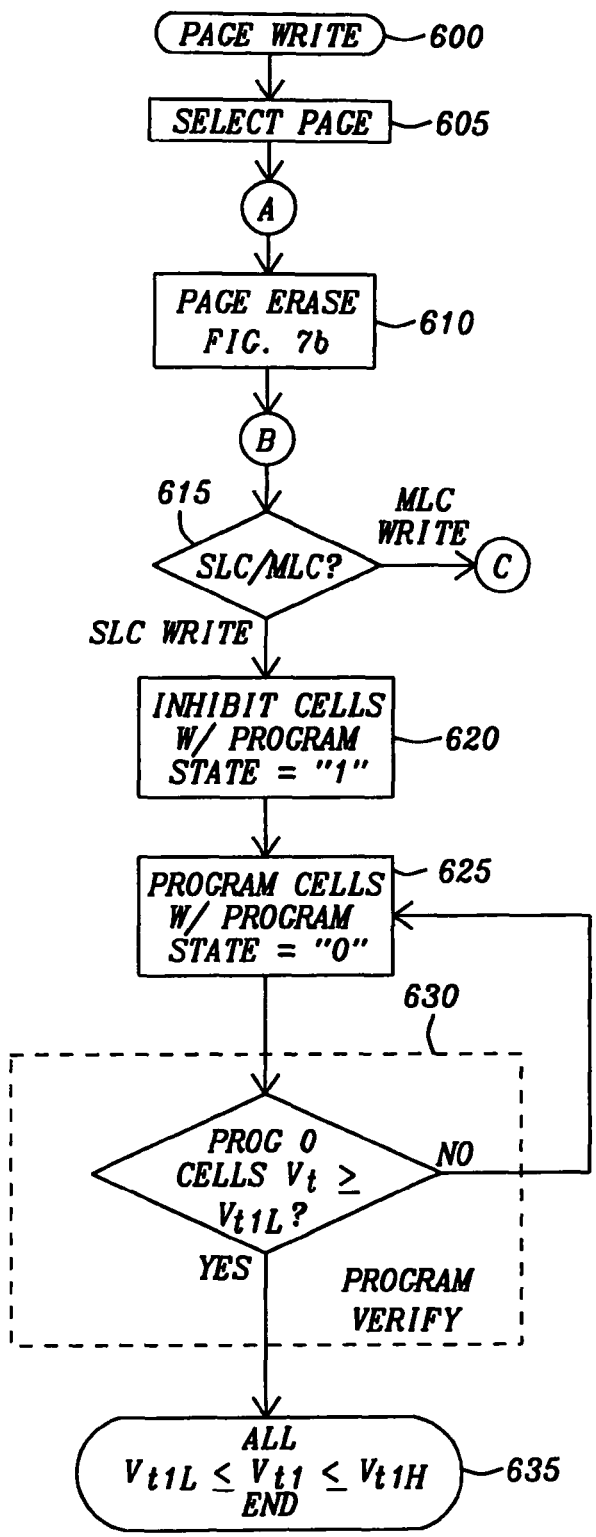
FIGS. 8a and 8b are a flowchart for performing page write operations on a NOR flash nonvolatile memory device embodying the principles of the present invention.
Figure 8B:
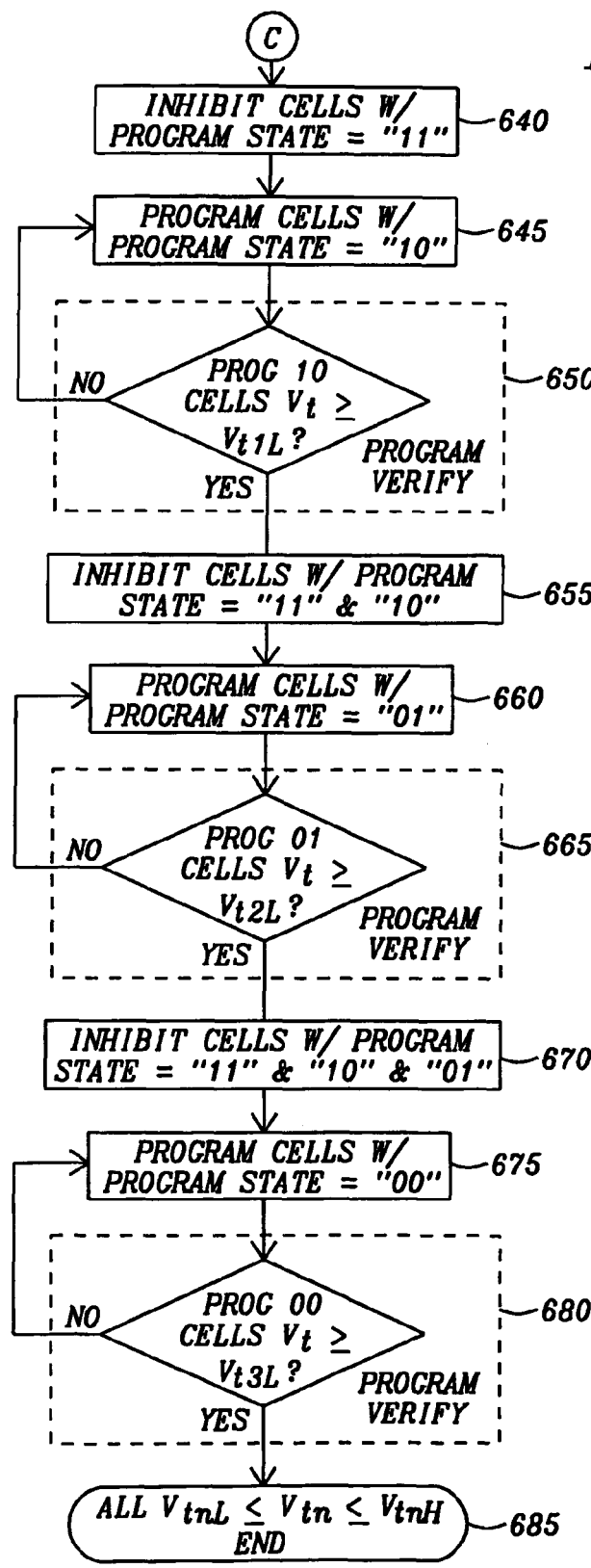

Continuing to refer now to FIGS. 3, 8a, 8b and FIG. 9 for the discussion of a method of operation of the NOR flash nonvolatile memory device 200, FIGS. 8a and 8b are a flowchart for performing a single level program and a multiple level program write operation of a selected page 215 within the NOR flash nonvolatile memory device 200. The method of operation continues with a write procedure (Box 600). A page 215 to be written is selected (Box 605). The selected page 215 is erased (Box 610). The erase procedure (Box 610) is as described in FIG. 7b. The type of page programming is determined (Box 615) whether it is to be a single level cell (SLC) programming or a multiple level cell (MLC) programming.

The erase procedure has set all the floating gate transistors M0 of the page 215 to be the first program state (1). To prevent the cells that are designated to be programmed with the first program state from being programmed further, those cells are inhibited (Box 620) from being programmed. To inhibit the programming of the designated cells, the column voltage control circuit 255 applies the large inhibit voltage level of approximately +10.0V to the global bit lines GBL0, ..., GBLn or the global source lines GSL0, ..., GSLn. The bit line select control sub-circuit 251 and the source line select control sub-circuit 253 activate the bit line select signals BLG0 and BLG1 and the source line select signals SLG0 and SLG1 selectively to connect the global bit lines GBL0, ..., GBLn or the global source lines GSL0, ..., GSLn appropriately to the those of the floating gate transistors M0 that are programmed to the first program state.

Those of the floating gate transistors M0 of the selected page 215 that are to be designated to be written the second program state (0) are programmed (Box 625). The program procedures is accomplished with the word line voltage control sub-circuit 252 applying the moderate inhibit voltage level of approximately +5.0V to the word lines WL1, ..., WLm-1, and WLm of the unselected pages to inhibit programming of these pages. The word line voltage control sub-circuit 252 applies the very large program voltage level (approximately +15.0V to approximately +22.0V) to the word line WL0 of the selected page 215. The column voltage control circuit 255 applies the program voltage level of approximately ground reference voltage level to the global bit lines GBL0, ..., GBLn or the global source lines GSL0, ..., GSLn. The bit line select control sub-circuit 251 and the source line select control sub-circuit 253 activate the bit line select signals BLG0 and BLG1 and the source line select signals SLG0 and SLG1 selectively to connect the global bit lines GBL0, ..., GBLn or the global source lines GSL0, ..., GSLn appropriately to the those of the floating gate transistors M0 that are programmed to the second program state (0). The shallow P-type diffusion well TPW is connected to the ground reference voltage and the deep N-type diffusion well DNW is connected to the power supply voltage source VDD. Placing the very large program voltage level at the control gates of the selected floating gate transistors M0 and the ground reference voltage at the channel of the floating gate transistors M0 cause a Fowler Nordheim tunneling phenomena to be triggered to attracted electron charge to the floating gate of the selected floating gate transistors M0 to program the selected floating gate transistors M0 to be programmed to the second program state (0).

The floating gate transistors M0 of the page 215 are then program verified (Box 630) to insure that all the floating gate transistors M0 of the selected page 215 have a threshold voltage level that is greater than the lower limit of the second program state Vt1L. Refer back now to FIGS. 3 and 9 for a discussion of the program verification (Box 630). The word line voltage control circuit 252 applies the ground reference voltage level to the word lines word lines WL1, WL2, ..., WLm-1, and WLm to inhibit a verification operation for the unselected dual floating gate transistor NOR flash cells 210. The word line voltage control circuit 252 applies the pass voltage level $V_{pass}$ to the word line WL1 connected to the unselected pass floating gate transistors M1 of the selected page of the dual floating gate transistor NOR flash cells 210. The word line voltage control circuit 252 applies a program verification voltage level that is the voltage level of the lower limit of the first program state Vt1L.

The program verification process (Box 630) is performed on one of two halves of the page 215 of the selected floating gate transistors M0. The bit line select control circuit 251 activates the bit line select signals BLG0 and BLG1 to a voltage level of the power supply voltage source VDD to activate the bit line select transistors 260a, ..., 260n to connect the selected local bit lines LBL0, LBL1, ..., LBLn-1, and LBLn to the global bit lines GBL0, ..., GBLn. The bit line select control circuit 251 activates the bit line select signals BLG0 and BLG1 to a voltage level of the ground reference voltage level to turnoff the bit line select transistors 260a, ..., 260n to disconnect the unselected local bit lines LBL0, LBL1, ..., LBLn-1, and LBLn to the global bit lines GBL0, GBLn. The column voltage control circuit 255 applies a read bias voltage level to the global bit lines GBL0, ..., GBLn and connects the sense amplifiers to the global bit lines GBL0, ..., GBLn. The global source lines GSL0, ..., GSLn and thus the global source lines GSL0, ..., GSLn are effectively connected to the ground reference voltage level such that the sense amplifier can detect the program state of the selected half of the selected page 215. The source line select control circuit 253 activates the source line select signals SLG0 and SLG1 to a voltage level of the power supply voltage source VDD to activate the source line select transistors 265a, ..., 265n to connect the selected local source lines LSL0, LSL1, ..., LSLn-1, and LSLn to the global source lines GSL0, ..., GSLn. The source line select control circuit 253 activates the source line select signals SLG0 and SLG1 to a voltage level of the ground reference voltage level to turnoff the source line select transistors 265a, ..., 265n to disconnect the unselected local source lines LSL0, LSL1, ..., LSLn−1, and LSLn to the global source lines GSL0, ..., GSLn. The column voltage control circuit 255 connects the sense amplifiers to the global bit lines GBL0, ..., GBLn and essentially sets the global source lines GSL0, ..., GSLn to the ground reference voltage level to detect the program state of the selected half of the selected floating gate transistors M0. Refer back now to FIG. 7a.

At the completion of the program verification (Box 630) of the first half of the selected page of selected floating gate transistors M0. The second half then has the program verification procedure (Box 630) performed. If any of the selected floating gate transistors M0 have failed the program verification procedure, those failing of the floating gate transistors M0 are reprogrammed (Box 625) to the second program state (0) and have the program verification procedure performed (Box 630) until all the floating gate transistors M0 of the selected page 215 are programmed to the second program state.

If the type of page programming is determined (Box 615) to be a multiple level cell (MLC) programming. The MLC write begins with the inhibiting (Box 640) those of the floating gate transistors M0 of the selected 215 that are designated to be programmed with the first program state (11) from being programmed further. The inhibiting procedure (Box 620) is identical to the inhibiting procedure (Box 620) of FIG. 8a.

Those of the floating gate transistors M0 of the selected page 215 that are to be designated to be written the second program state (01) are programmed (Box 645). The program procedure (Box 645) is accomplished as described for the program procedure (Box 625) of the second program state (0) of the single level cell program of FIG. 8a. Upon completion of the programming (Box 660) of the selected page 215, the selected page 215 is then program verified (Box 665) to insure that all the floating gate transistors M0 of the selected page 215 have a threshold voltage level that is greater than the lower limit of the third program state Vt2L. The program verification procedure (Box 665) is the same as the program verification procedure (Box 630) of the second program state of the single level cell program of FIG. 8a.

Those of the floating gate transistors M0 of the selected 215 that are programmed with the first program state (11) and second program state (10) are inhibited (Box 655) from being programmed further. Again, the inhibiting procedure (Box 655) is identical to the inhibiting procedure (Box 620) of FIG. 8a.

Those of the floating gate transistors M0 of the selected page 215 that are to be designated to be written the third program state (01) are programmed (Box 660). The program procedure (Box 645) is accomplished as described for the program procedure (Box 625) of the second program state of the single level cell program of FIG. 8a. Upon completion of the programming (Box 645) of the floating gate transistors M0 of the selected page 215 that are to be designated to be written the third program state (01), the selected page 215 is then program verified (Box 650) to insure that all the floating gate transistors M0 of the selected page 215 have a threshold voltage level that is greater than the lower limit of the third program state Vt2L. The program verification procedure (Box 650) is the same as the program verification procedure (Box 630) of the second program state (0) of the single level cell program of FIG. 8a.

Those of the floating gate transistors M0 of the selected 215 that are programmed with the first program state (11), the second program state (10) and the third program state (01) are inhibited (Box 670) from being programmed further. Again, the inhibiting procedure (Box 670) is identical to the inhibiting procedure (Box 620) of FIG. 8a.

Those of the floating gate transistors M0 of the selected page 215 that are to be designated to be written the fourth program state (00) are programmed (Box 675). The program procedure (Box 675) is accomplished as described for the program procedure (Box 625) of the second program state (0) of the single level cell program of FIG. 8a. Upon completion of the programming (Box 675) of the floating gate transistors M0 of the selected page 215 that are to be designated to be written the fourth program, state (00), the selected page 215 is then program verified (Box 680) to insure that all the selected floating gate transistors M0 of the selected page 215 have a threshold voltage level that is greater than the lower limit of the fourth program state Vt3L. The program verification procedure (Box 680) is the same as the program verification procedure (Box 630) of the second program state (0) of the single level cell program of FIG. 8a.

The Fowler Nordheim tunneling phenomena has an erase current of approximately 1na for each page of the array of the NOR flash nonvolatile memory device 200 of FIG. 3. This level of current permits a charge pump power supply for the shallow well voltage generator 467 and the deep well voltage generator 468 to sufficiently small for the erase voltage to permit a block erase. In the prior art where the erase employs a channel hot electron injection phenomena, the current is much larger and the erase is generally restricted to a page erase.

The lower erase current allows for a block erase within approximately 1 msec. The erase verification time and over-erase verification time is approximately 1 μsec per operation. If there are 1000 pages within a block 205 of the NOR flash nonvolatile memory device 200, then the total time for the erase of a block becomes approximately 6 ms, which is significantly less than the time for an equivalent block erase of a flash NOR nonvolatile memory of the prior art of greater than 100 msec.

In other implementations embodying the principles of the present invention, the dual floating gate transistor NOR flash cells 210 may be a dual charge retaining transistor NOR flash cells 210 implemented with SONOS or MONOS charge is trapping transistors. Further, in even other implementations embodying the principles of the present invention, the diffusion species may be altered to reverse the conductivity of the diffusions of the charge retaining transistors, as shown. The reversal of the diffusion species from those shown in FIGS. 1a, 1b-1, 1b-2, 1c-1, and 1c-2 changes the floating gate transistors M0 and M1 from NMOS floating gate transistors to PMOS floating gate transistors. Further, the charge retaining transistors may retain the charge as holes rather than electrons. The voltages required for erasing, verifying, reading, and programmed are appropriately reversed and adjusted.

While this invention has been particularly shown and described with reference to the preferred embodiments thereof, it will be understood by those skilled in the art that various changes in form and details may be made without departing from the spirit and scope of the invention.

The invention claimed is:

1. A method of operating a dual charge retaining transistor NOR flash memory device for the correction of over-erasure comprising:
   erasing a block of pages of dual charge retaining transistor NOR flash cells, erasing comprising;
   selecting one block section of a plurality of block sections of the block of dual charge retaining transistor NOR flash cells;

erasing a plurality of charge retaining transistors of the selected block section of the dual charge retaining transistor NOR flash cells;

verifying that each page of the block section of the charge retaining transistors is erased to a threshold voltage level of an upper limit of a first program state;

if any of the charge retaining transistors within a selected page of the block section have their threshold voltage level greater than the upper limit of the first program state, repetitively erasing the selected block section and verifying the selected page of charge retaining transistor until all the charge retaining transistors have their threshold voltage levels less than the upper limit of the first program state;

verifying that each page of charge retaining transistors is not over-erased to the threshold voltage level that is less than a lower limit of the first program state; and if any of the charge retaining transistors one selected page has their threshold voltage levels less than a lower limit of the first program state, repetitively programming and verifying those charge retaining transistors of the one selected page to bring their threshold voltage levels to be greater than the lower limit of the first program state.

2. The method of operating a dual charge retaining transistor NOR flash memory device of claim 1 wherein pairs of columns of the block of dual charge retaining NOR flash memory cells share one global bit line and one global source line such that verifying includes;

selecting a first of the pairs of columns connected to the selected page of charge retaining transistors;

verifying the charge retaining transistors connected to the first column of the pairs of columns;

inhibiting a second of the pairs of columns from verifying;

upon verifying the charge retaining transistors connected to the first of the pairs of columns, selecting a second of the pairs of columns;

verifying the charge retaining transistors connected to the second of the pairs of columns; and inhibiting the first of the pairs of columns from verifying.

3. The method of operating a dual charge retaining transistor NOR flash memory device of claim 1 further comprising:

inhibiting erasing of unselected block sections of the plurality of block sections of the block of dual charge retaining transistor NOR flash cells.

4. The method of operating a dual charge retaining transistor NOR flash memory device of claim 1 further comprising:

iteratively, selecting another block section of the plurality of block sections; and repetitively erasing, erase verifying, programming, and over-erase verifying until the charge retaining transistors of the other block section to have their threshold voltages between the lower limit of the first program state and the upper limit of the first program state.

5. The method of operating a dual charge retaining transistor NOR flash memory device of claim 1 further comprising:

erasing a single page of the charge retaining transistor by:

selecting the single page for erasing;

inhibiting the unselected pages from erasing;

erasing the selected page;

verifying that the threshold voltage levels of the charge retaining transistor are less than the upper limit of the first program state and;

repetitively erasing and erase verifying until the threshold voltage levels are all less than the upper limit of the first program state;

verifying that the selected single page of charge retaining transistors is not over-erased to the threshold voltage level that is less than a lower limit of the first program state;

if the threshold voltage levels of any of the charge retaining transistors is less than the lower limit of the first program state, programming and over-erase verifying until all the charge retaining transistors have their threshold voltage levels are greater than the lower limit of the first program state.

6. The method of operating a dual charge retaining transistor NOR flash memory device of claim 5 wherein pairs of columns of the block of dual charge retaining NOR flash memory cells share one global bit line and one global source line such that verifying includes;

selecting a first of the pairs of columns connected to the selected page of charge retaining transistors;

verifying the charge retaining transistors connected to the first column of the pairs of columns;

inhibiting a second of the pairs of columns from verifying;

upon verifying the charge retaining transistors connected to the first column, selecting the second of the pairs of columns;

verifying the charge retaining transistors connected to the second column of the pairs of columns;

inhibiting the first of the pairs of columns from verifying.

7. The method of operating a dual charge retaining transistor NOR flash memory device of claim 1 further comprising:

programming of a page of the charge retaining transistors by:

selecting the page of the charge retaining transistors for programming;

erasing and programming the page of charge retaining transistors to the threshold voltage level that is greater than the lower limit of the first program state and less than the upper limit of the first program state;

selecting those charge retaining transistors that are to be programmed to a second program state programming the selected charge retaining transistors to the second program state;

verifying that the selected charge retaining transistors have their threshold voltage levels greater than a lower limit of the second program state; and if the selected charge retaining transistors have their threshold voltage level less that the lower limit of the second program state, and repetitively programming and program verifying the selected charge retaining transistors until all the charge retaining transistors of the selected page have their threshold voltage levels greater than the lower limit of the second program state.

8. The method of operating a dual charge retaining transistor NOR flash memory device of claim 7 wherein the very large program voltage is approximately +15.0V to approximately +22.0V, the large program inhibit gating voltage is approximately +10.0V, the moderately large program inhibit voltage is approximately +5.0V, and the ground reference voltage level.

9. The method of operating a dual charge retaining transistor NOR flash memory device of claim 7 wherein pairs of columns of the block of dual charge retaining NOR flash memory cells share one global bit line and one global source line such that verifying includes;

selecting a first of the pairs of columns connected to the selected page of charge retaining transistors;

verifying the charge retaining transistors connected to the first column of the pairs of columns;

inhibiting a second of the pairs of columns from verifying;
upon verifying the charge retaining transistors connected to the first column, selecting the second of the pairs of columns;
verifying the charge retaining transistors connected to the second of the pairs of columns; and
inhibiting the first of the pairs of columns from verifying.

10. The method of operating a dual charge retaining transistor NOR flash memory device of claim 7 further comprising:
if the page of charge retaining transistors is to be programmed with more than two program states, programming and program verifying those charge retaining transistors that are to be programmed to the additional program states.

11. The method of operating a dual charge retaining transistor NOR flash memory device of claim 1 further comprising
reading a page of the charge retaining transistors by:
selecting the page of charge retaining transistors
applying a read voltage to control gates of the selected page of the charge retaining transistors;
inhibiting the unselected pages of the charge retaining transistors;
selecting a first of pairs of columns connected to the selected page of charge retaining transistors;
sensing the program state of the charge retaining transistors connected to the first of the pairs of columns;
inhibiting a second of the pairs of columns from reading;
upon reading the charge retaining transistors connected to the first of the pairs of column, selecting the second of the pairs of columns;
sensing the program state of the charge retaining transistors connected to the second of the pairs of columns; and
inhibiting the first of the pairs of columns from verifying.

12. The method of operating a dual charge retaining transistor NOR flash memory device of claim 1 wherein if the charge retaining transistor are programmed with more than two data states, the reading further comprises:
applying multiple read voltage levels to the control gates of the selected page charge retaining transistors to determine which of the multiple programmed data states is programmed to the charge retaining transistors.

13. An apparatus for operating a dual charge retaining transistor NOR flash memory device for the correction of over-erasure comprising:
means for erasing a block of pages of dual charge retaining transistor NOR flash cells, the means for erasing comprising;
means for selecting one block section of a plurality of block sections of the block of dual charge retaining transistor NOR flash cells;
means for erasing a plurality of charge retaining transistors of the selected block section of the dual charge retaining transistor NOR flash cells;
means for verifying that each page of the block section of the charge retaining transistors is erased to a threshold voltage level of an upper limit of a first program state
means for repetitively erasing the selected block and verifying the selected page of charge retaining transistor until all the charge retaining transistors have their threshold voltage levels less than the upper limit of the first program state, if any of the charge retaining transistors within a selected page of the block section have their threshold voltage level greater than the upper limit of the first program state;
means for verifying that each page of charge retaining transistors is not over-erased to the threshold voltage level that is less than a lower limit of the first program state; and
means for repetitively programming and verifying those charge retaining transistors of the one selected page to bring their threshold voltage levels to be greater than the lower limit of the first program state, if any of the charge retaining transistors one selected page has their threshold voltage levels less than a lower limit of the first program state.

14. The apparatus for operating a dual charge retaining transistor NOR flash memory device of claim 13 wherein pairs of columns of the block of dual charge retaining NOR flash memory cells share one global bit line and one global source line such that the means for verifying includes;
means for selecting a first of the pairs of columns connected to the selected page of charge retaining transistors;
means for verifying the charge retaining transistors connected to the first of the pairs of columns;
means for inhibiting a second of the pairs of columns from verifying;
means for selecting the second of the pairs of columns upon verifying the charge retaining transistors connected to the first of the pairs of columns,
means for verifying the charge retaining transistors connected to the second of the pairs of columns; and
means for inhibiting the first of the pairs of columns from verifying.

15. The apparatus for operating a dual charge retaining transistor NOR flash memory device of claim 13 further comprising:
means for inhibiting erasing of unselected block sections of the plurality of block sections of the block of dual charge retaining transistor NOR flash cells.

16. The apparatus for operating a dual charge retaining transistor NOR flash memory device of claim 13 further comprising:
means for iteratively, selecting another block section of the plurality of page sets; and
means for repetitively erasing, erase verifying, programming, and over-erase verifying until the charge retaining transistors of the other block section to have their threshold voltages between the lower limit of the first program state and the upper limit of the first program state.

17. The apparatus for operating a dual charge retaining transistor NOR flash memory device of claim 13 further comprising:
means for erasing a single page of the charge retaining transistor comprising:
means for selecting the single page for erasing
means for inhibiting the unselected pages from erasing;
means for erasing the selected page;
means for verifying that the threshold voltage levels of the charge retaining transistor are less than the upper limit of the first program state and;
means for repetitively erasing and erase verifying until the threshold voltage levels are all less than the upper limit of the first program state;
means for verifying that the selected single page of charge retaining transistors is not over-erased to the threshold voltage level that is less than a lower limit of the first program state;

means for programming and program verifying until all the charge retaining transistors have their threshold voltage levels are greater than the lower limit of the first program state, if the threshold voltage levels of any of the charge retaining transistors is less than the lower limit of the first program state.

18. The apparatus for operating a dual charge retaining transistor NOR flash memory device of claim 16 wherein pairs of columns of the block of dual charge retaining NOR flash memory cells share one global bit line and one global source line such that the means for verifying includes;
means for selecting a first of the pairs of columns connected to the selected page of charge retaining transistors;
means for verifying the charge retaining transistors connected to the first column of the pairs of columns;
means for inhibiting a second of the pairs of columns from verifying;
means for selecting the second of the pairs of columns upon verifying the charge retaining transistors connected to the first column;
means for verifying the charge retaining transistors connected to the second column of the pairs of columns;
means for inhibiting the first of the pairs of columns from verifying.

19. The apparatus for operating a dual charge retaining transistor NOR flash memory device of claim 13 further comprising:
means for programming of a page of the charge retaining transistors comprising:
means for selecting the page of the charge retaining transistors for programming;
means for erasing and programming the page of charge retaining transistors to the threshold voltage level that is greater than the lower limit of the first program state and less than the upper limit of the first program state;
means for selecting those charge retaining transistors that are to be programmed to a second program state
means for programming the selected charge retaining transistors to the second program state;
means for verifying that the selected charge retaining transistors have their threshold voltage levels greater than a lower limit of the second program state; and
means for repetitively programming and program verifying the selected charge retaining transistors until all the charge retaining transistors of the selected page have their threshold voltage levels greater than the lower limit of the second program state, if the selected charge retaining transistors have their threshold voltage level less that the lower limit of the second program state.

20. The apparatus for operating a dual charge retaining transistor NOR flash memory device of claim 19 wherein the very large program voltage is approximately +15.0V to approximately +22.0V, the large program inhibit gating voltage is approximately +10.0V, the moderately large program inhibit voltage is approximately +5.0V, and the ground reference voltage level.

21. The apparatus for operating a dual charge retaining transistor NOR flash memory device of claim 19 wherein pairs of columns of the block of dual charge retaining NOR flash memory cells share one global bit line and one global source line such that the means for verifying includes;
means for selecting a first of the pairs of columns connected to the selected page of charge retaining transistors;
means for verifying the charge retaining transistors connected to the first column of the pairs of columns;
means for inhibiting a second of the pairs of columns from verifying;
means for selecting the second of the pairs of columns upon verifying the charge retaining transistors connected to the first column;
means for verifying the charge retaining transistors connected to the second column of the pairs of columns; and
means for inhibiting the first of the pairs of columns from verifying.

22. The apparatus for operating a dual charge retaining transistor NOR flash memory device of claim 20 further comprising:
means for programming and program verifying those charge retaining transistors that are to be programmed to the additional program states, if the page of charge retaining transistors is to be programmed with more than two program states.

23. The apparatus for operating a dual charge retaining transistor NOR flash memory device of claim 13 further comprising
means for reading a page of the charge retaining transistors comprising:
means for selecting the page of charge retaining transistors;
means for applying a read voltage to control gates of the selected page of the charge retaining transistors;
means for inhibiting the unselected pages of the charge retaining transistors;
means for selecting a first of pairs of columns connected to the selected page of charge retaining transistors;
means for sensing the program state of the charge retaining transistors connected to the first column of the pairs of columns;
means for inhibiting a second of the pairs of columns from reading;
means for selecting the second of the pairs of columns, upon reading the charge retaining transistors connected to the first of the pairs of column;
means for sensing the program state of the charge retaining transistors connected to the second of the pairs of columns; and
means for inhibiting the first of the pairs of columns from verifying.

24. The apparatus for operating a dual charge retaining transistor NOR flash memory device of claim 13 wherein if the charge retaining transistors are programmed with more than two data states, the means for reading further comprises:
applying multiple read voltage levels to the control gates of the selected page charge retaining transistors to determine which of the multiple programmed data states is programmed to the charge retaining transistors.

25. A NOR flash nonvolatile memory device comprises:
at least one array block of NOR flash memory cells wherein the NOR flash memory cells are arranged in rows and columns, wherein the at least one block comprises a plurality of block sections of dual charge retaining transistor NOR flash cells and each of the NOR flash memory cells comprises at least two serially connected charge retaining transistors;
a plurality of local bit lines connected such that a drain/source of a first of the at least two charge retaining transistors on each column of NOR flash memory cells is connected to one local bit line;
a plurality of local source lines connected such that a source/drain of a second of the at least two charge retaining transistors on each column of NOR flash memory cells is connected to one local source line;

a plurality of global bit lines connected such that at least one of the local bit lines is in communication with one global bit line;

a plurality of bit line gating transistors, each bit line gating transistor connected between one local bit line and its associated global bit line;

a plurality of global source lines connected such that at least one of the local source lines is in communication with one global source line;

a plurality of source line gating transistors, each source line gating transistor connected between one local source line and its associated global source line;

a plurality of word lines connected such that a control gate of each of the first charge retaining transistors on each row of NOR flash memory cells is connected to one word line and the control gates of the second charge retaining transistors on the row of NOR flash memory cells is connected to a separate word line;

a row voltage control circuit connected to each word line connected to the control gates of each row of charge retaining transistors of the NOR flash memory cells; and a column voltage control circuit connected to each of the bit lines and source lines connected to the columns of the array of NOR flash memory cells;

wherein the row voltage control circuit generates erase voltage signals for erasing each block section of the array block for the correction of over-erasure, generates erase verifying signals for verifying that each page of the block section of the charge retaining transistors erased to a threshold voltage level less than an upper limit of a first program state, generating over-erase verifying signals for verifying that each page of charge retaining transistors is then verified that the threshold voltage level of each charge retaining transistor is greater than a lower limit of the first program state and generates program voltage signals for programming those charge retaining transistors that have their threshold voltage level less than the lower limit of the first program state;

wherein if any of the charge retaining transistors within a selected page of the block section have their threshold voltage level greater than the upper limit of the first program state, the row voltage control circuit and the column voltage repetitively generates the erase voltage signals for erasing the block section and generates erase verifying signals for verifying the selected page of charge retaining transistor until all the charge retaining transistors have their threshold voltage levels less than the upper limit of the first program state; and wherein if any of the charge retaining transistors one selected page has their threshold voltage levels less than a lower limit of the first program state, the row voltage control circuit and the column voltage repetitively generates programming voltage signals and over-erase verifying voltage signals until those charge retaining transistors of the one selected page have their threshold voltage levels greater than the lower limit of the first program state; and wherein the row voltage control circuit selects one block section of a plurality of block sections of the block of dual charge retaining transistor NOR flash for erasing and verifying followed the another of the block sections with each block section being sequentially erase and verified.

26. The NOR flash nonvolatile memory device of claim 25 wherein each row of the first charge retaining transistors forms one block section of the block sections of the charge retaining transistors.

27. The NOR flash nonvolatile memory device of claim 25 wherein the row control circuit comprises an erase voltage generator for generating the very large erase inhibit voltage level of from approximately +18.0V to approximately +22.0V (nominally +20.0V) and erase voltage level that is a ground reference voltage level.

28. The NOR flash nonvolatile memory device of claim 27 wherein the row voltage control circuit comprises a row read/verify voltage generating circuit and the column voltage control circuit comprises a column read/verify voltage generating circuit wherein the erase verifying signals are generated by:

the row read/verify voltage generating circuit generates an upper limit of the first program state for application to the word line of the selected page being erase verified;

the row read/verify voltage generating circuit generates a pass voltage level to be applied to the word line of the charge retaining transistors connected to the charge retaining transistors of the selected page to turn on the connected charge retaining transistors;

the row read/verify voltage generating circuit generates a page verify inhibit voltage level of approximately the ground reference voltage level to inhibit verification of the unselected pages of charge retaining transistors;

the column read/verify voltage generating circuit applies a read bias voltage level to the global bit lines and thus to the selected charge retaining transistors; and the column voltage control circuit connects sense amplifiers to the global bit lines to sense the program state programmed to the selected charge retaining transistors.

29. The NOR flash nonvolatile memory device of claim 27 wherein the over-erase verifying signals are generated by:

the row read/verify voltage generating circuit generates a lower limit of the first program state for application to the word line of the selected page being erase verified;

the row read/verify voltage generating circuit generates a pass voltage level to be applied to the word line of the charge retaining transistors connected to the charge retaining transistors of the selected page to turn on the connected charge retaining transistors;

the row read/verify voltage generating circuit generates a page verify inhibit voltage level of approximately the ground reference voltage level to inhibit verification of the unselected pages of charge retaining transistors;

the column read/verify voltage generating circuit applies a read bias voltage level to the global bit lines and thus to the selected charge retaining transistors; and the column voltage control circuit connects sense amplifiers to the global bit lines to sense the program state programmed to the selected charge retaining transistors.

30. The NOR flash nonvolatile memory device of claim 28 wherein the pass voltage level is a voltage level of the upper limit of a largest program state plus a voltage differential of approximately +1.0V.

31. The NOR flash nonvolatile memory device of claim 24 wherein for programming a selected page of the charge retaining transistors:

the row voltage control circuit and the column voltage control circuit generate the erase voltage signals to erase the selected page and generates the erase verifying signals for verifying the erase of the selected page has set the threshold voltage of the charge retaining transistors of the selected page to be less than the upper limit of the first program state, generates the over-erase verifying signals for verifying that the erase of the selected page has set the threshold voltage of the charge retaining transistors of the selected page to be greater than the lower limit of the first program state; and for those charge retaining transistors that are to be programmed to the second program state, the row voltage control circuit and the column voltage control circuit generates the program voltage signals to program the selected charge retaining transistors that are to be programmed to the second logic state and generates the program verifying signals for verifying that the selected charge retaining transistors are programmed to the second program state.

32. The NOR flash nonvolatile memory device of claim 31 wherein the program voltage signals are generated by:

the word line controller applying the very large program voltage to the selected word line and the moderately large program inhibit voltage to the unselected word lines;

the bit line and source line voltage controllers apply the bit line gate select and source line gate select voltages to the gates of the bit line select transistors and the gates of the source line select transistors to connect the local bit lines and local source lines respectively to the global bit lines and the global source lines;

the column voltage control circuit applies the ground reference voltage level to the bit lines or the source lines for programming those of the charge retaining transistors where their threshold voltage level are less than the lower limit of the second program state; and the column voltage control circuit applies the large program inhibit voltage level to the bit lines or source lines for inhibiting the programming those of the charge retaining transistors that have their threshold voltage level set to the first program state.

33. The NOR flash nonvolatile memory device of claim 32 wherein the row voltage control circuit comprises a program voltage generator for generating the very large program voltage is approximately +15.0V to approximately +22.0V, the large program inhibit gating voltage is approximately +10.0V, the moderately large program inhibit voltage is approximately +5.0V, and the ground reference voltage level.

34. The NOR flash nonvolatile memory device of claim 33 wherein the column voltage control circuit comprises a column program circuit to generate the program voltage signals including a program inhibit voltage level of approximately +10.0V to the bit lines or source lines connected to those charge retaining transistors that are not to be programmed and to provide the ground reference voltage to the bit lines and source lines of the charge retaining transistors that are to be programmed.

35. The NOR flash nonvolatile memory device of claim 33 wherein the row voltage control circuit comprises a row read/verify voltage generating circuit and the column voltage control circuit comprises a column read/verify voltage generating circuit wherein the program verifying signals are generated by:

the row read/verify voltage generating circuit generates a lower limit of the program state being verified for application to the word line of the selected page being program verified;

the row read/verify voltage generating circuit generates a pass voltage level to be applied to the word line of the charge retaining transistors connected to the charge retaining transistors of the selected page to turn on the connected charge retaining transistors;

the row read/verify voltage generating circuit generates a page verify inhibit voltage level of approximately the ground reference voltage level to inhibit verification of the unselected pages of charge retaining transistors;

the column read/verify voltage generating circuit applies a read bias voltage level to the global bit lines and thus to the selected charge retaining transistors; and the column voltage control circuit connects sense amplifiers to the global bit lines to sense the program state programmed to the selected charge retaining transistors.

36. The NOR flash nonvolatile memory device of claim 35 wherein the pass voltage level is a voltage level of the upper limit of a largest program state plus a voltage differential of approximately +1.0V.

37. The NOR flash nonvolatile memory device of claim 28 wherein if the selected page of charge retaining transistors is to be programmed with additional program state more than two program states, the row voltage control circuit and column voltage control circuit generate the program voltage signals to be applied to the control gates of those charge retaining transistors that are to be programmed to the additional program states are programmed and generates the program verification signals for program verifying to those additional program states.

38. The NOR flash nonvolatile memory device of claim 24 wherein the row voltage control circuit generates read voltage signals for reading the program state of a selected page of the charge retaining transistors.

39. The NOR flash nonvolatile memory device of claim 37 wherein the row voltage control circuit comprises a row read/verify voltage generating circuit and the column voltage control circuit comprises a column read/verify voltage generating circuit wherein read signals are generated by:

the row read/verify voltage generating circuit generates a lower limit of the program state being read for application to the word line of the selected page being read;

the row read/verify voltage generating circuit generates a pass voltage level to be applied to the word line of the charge retaining transistors connected to the charge retaining transistors of the selected page to turn on the connected charge retaining transistors;

the row read/verify voltage generating circuit generates a page verify inhibit voltage level of approximately the ground reference voltage level to inhibit read of the unselected pages of charge retaining transistors;

the column read/verify voltage generating circuit applies a read bias voltage level to the global bit lines and thus to the selected charge retaining transistors; and the column voltage control circuit connects sense amplifiers to the global bit lines to sense the program state programmed to the selected charge retaining transistors.

40. The NOR flash nonvolatile memory device of claim 39 wherein the pass voltage level is a voltage level of the upper limit of a largest program state plus a voltage differential of approximately +1.0V.

41. The NOR flash nonvolatile memory device of claim 24 wherein the column voltage control circuit comprises a well bias control circuit that includes a shallow well generator connected to a shallow diffusion well of a second conductivity type into which the array block of NOR flash memory cells is formed and a deep well generator connected to a deep diffusion well of a first conductivity type into which the shallow diffusion well is formed such that the deep well generator generates a voltage level of the power supply voltage source for programming, verification, and reading of the array of NOR flash memory cells and generates a very large erase voltage for erasing a selected block or page of the array of NOR flash memory cells and the shallow well generator transfers the voltage level of the ground reference voltage source for programming, verification, and reading of the array of NOR flash memory cells and generates a very large erase voltage level that is applied to the shallow well of the second conductivity type to attract the charges from the charge retaining region during the erase.

42. The NOR flash nonvolatile memory device of claim 41 wherein the very large erase voltage level is from approximately +18.0V to approximately +22.0V (nominally +20.0V) to activate a Fowler Nordheim tunneling phenomena to extract charge from the charge retaining region during the erase.

43. An operating apparatus for preventing over-erasing of an array of NOR flash memory cells that are arranged in rows and columns, wherein each of the NOR flash memory cells comprises two serially connected charge retaining transistors, wherein the operating apparatus comprises:
  a row voltage control circuit connected to each of a plurality word lines of the array of NOR flash memory cells that are connected to the control gates of each row of charge retaining transistors of the NOR flash memory cells; and
  a column voltage control circuit connected to each of the bit lines and source lines connected to the columns of the array of NOR flash memory cells;
  wherein the row voltage control circuit generates erase voltage signals for erasing each block section of the array block for the correction of over-erasure, generates erase verifying signals for verifying that each page of the block section of the charge retaining transistors erased to a threshold voltage level of an upper limit of a first program state, generating over-erase verifying signals for verifying that the each page of charge retaining transistors is then verified that the threshold voltage level of each charge retaining transistor is greater than a lower limit of the first program state and generates program voltage signals for programming those charge retaining transistors that have their threshold voltage level less than the lower limit of the first program state;
  wherein if any of the charge retaining transistors within a selected page of the block section have their threshold voltage level greater than the upper limit of the first program state, the row voltage control circuit and the column voltage repetitively generates the erase voltage signals for erasing and generates erase verifying signals for verifying the selected page of charge retaining transistor until all the charge retaining transistors have their threshold voltage levels less than the upper limit of the first program state; and
  wherein if any of the charge retaining transistors one selected page has their threshold voltage levels less than a lower limit of the first program state, the row voltage control circuit and the column voltage circuit repetitively generates programming voltage signals and over-erase verifying voltage signals until those charge retaining transistors of the one selected page have their threshold voltage levels greater than the lower limit of the first program state; and
  wherein the row voltage control circuit selects one block section of a plurality of block sections of the block of dual charge retaining transistor NOR flash for erasing and verifying followed the another of the block sections with each block section being sequentially erase and verified.

44. The operating apparatus for preventing over-erasing of claim 43 wherein each row of the first charge retaining transistors forms a first block section of the block sections of the charge retaining transistors and each row of the second charge retaining transistors forms a second block section of the block sections of the charge retaining transistors.

45. The operating apparatus for preventing over-erasing of claim 43 wherein the row control circuit comprises an erase voltage generator for generating the very large erase inhibit voltage level of from approximately +18.0V to approximately +22.0V (nominally +20.0V) and erase voltage level that is a ground reference voltage level.

46. The operating apparatus for preventing over-erasing of claim 45 wherein the row voltage control circuit comprises a row read/verify voltage generating circuit and the column voltage control circuit comprises a column read/verify voltage generating circuit wherein the erase verifying signals are generated by:
  the row read/verify voltage generating circuit generates a lower limit of the first program state for application to the word line of the selected page being erased;
  the row read/verify voltage generating circuit generates a pass voltage level to be applied to the word line of the charge retaining transistors connected to the charge retaining transistors of the selected page to turn on the connected charge retaining transistors;
  the row read/verify voltage generating circuit generates a page verify inhibit voltage level of approximately the ground reference voltage level to inhibit verification of the unselected pages of charge retaining transistors;
  the column read/verify voltage generating circuit applies a read bias voltage level to the global bit lines and thus to the selected charge retaining transistors; and
  the column voltage control circuit connects sense amplifiers to the global bit lines to sense the program state programmed to the selected charge retaining transistors.

47. The operating apparatus for preventing over-erasing of claim 46 wherein the pass voltage level is a voltage level of the upper limit of a largest program state plus a voltage differential of approximately +1.0V.

48. The operating apparatus for preventing over-erasing of claim 43 wherein for programming a selected page of the charge retaining transistors:
  the row voltage control circuit and the column voltage control circuit generate the erase voltage signals to erase the selected page and generates the erase verifying signals for verifying the erase of the selected page has set the threshold voltage of the charge retaining transistors of the selected page to be less than the upper limit of the first program state, generates the over-erase verifying signals for verifying that the erase of the selected page has set the threshold voltage of the charge retaining transistors of the selected page to be greater than the lower limit of the first program state; and
  for those charge retaining transistors that are to be programmed to the second program state, the row voltage control circuit and the column voltage control circuit generates the program voltage signals to program the selected charge retaining transistors that are to be programmed to the second logic state and generates the program verifying signals for verifying that the selected charge retaining transistors are programmed to the second program state.

49. The operating apparatus for preventing over-erasing of claim 48 wherein the program voltage signals are generated by:
- the word line controller applying the very large program voltage to the selected word line and the moderately large program inhibit voltage to the unselected word lines;
- the bit line and source line voltage controllers apply the bit line gate select and source line gate select voltages to the gates of the bit line select transistors and the gates of the source line select transistors to connect the local bit lines and local source lines respectively to the global bit lines and the global source lines;
- the column voltage control circuit applies the ground reference voltage level to the bit lines or the source lines for programming those of the charge retaining transistors where their threshold voltage level are less than the lower limit of the second program state; and
- the column voltage control circuit applies the large program inhibit voltage level to the bit lines or source lines for inhibiting the programming those of the charge retaining transistors that have their threshold voltage level set to the first program state.

50. The operating apparatus for preventing over-erasing of claim 49 wherein the row voltage control circuit comprises a program voltage generator for generating the very large program voltage is approximately +15.0V to approximately +22.0V, the large program inhibit gating voltage is approximately +10.0V, the moderately large program inhibit voltage is approximately +5.0V, and the ground reference voltage level.

51. The operating apparatus for preventing over-erasing of claim 50 wherein the column voltage control circuit comprises a column program circuit to generate the program voltage signals including a program inhibit voltage level of approximately +10.0V to the bit lines or source lines connected to those charge retaining transistors that are not to be programmed and to provide the ground reference voltage to the bit lines and source lines of the charge retaining transistors that are to be programmed.

52. The operating apparatus for preventing over-erasing of claim 49 wherein the row voltage control circuit comprises a row read/verify voltage generating circuit and the column voltage control circuit comprises a column read/verify voltage generating circuit wherein the program verifying signals are generated by:
- the row read/verify voltage generating circuit generates a lower limit of the program state being verified for application to the word line of the selected page being programmed;
- the row read/verify voltage generating circuit generates a pass voltage level to be applied to the word line of the charge retaining transistors connected to the charge retaining transistors of the selected page to turn on the connected charge retaining transistors;
- the row read/verify voltage generating circuit generates a page verify inhibit voltage level of approximately the ground reference voltage level to inhibit verification of the unselected pages of charge retaining transistors;
- the column read/verify voltage generating circuit applies a read bias voltage level to the global bit lines and thus to the selected charge retaining transistors; and
- the column voltage control circuit connects sense amplifiers to the global bit lines to sense the program state programmed to the selected charge retaining transistors.

53. The operating apparatus for preventing over-erasing of claim 52 wherein the pass voltage level is a voltage level of the upper limit of a largest program state plus a voltage differential of approximately +1.0V.

54. The operating apparatus for preventing over-erasing of claim 46 wherein if the selected page of charge retaining transistors is to be programmed with additional program state more than two program states, the row voltage control circuit and column voltage control circuit generate the program voltage signals to be applied to the control gates of those charge retaining transistors that are to be programmed to the additional program states are programmed and generates the program verification signals for program verifying to those additional program states.

55. The operating apparatus for preventing over-erasing of claim 43 wherein the row voltage control circuit generates read voltage signals for reading the program state of a selected page of the charge retaining transistors.

56. The operating apparatus for preventing over-erasing of claim 55 wherein the row voltage control circuit comprises a row read/verify voltage generating circuit and the column voltage control circuit comprises a column read/verify voltage generating circuit wherein read signals are generated by:
- the row read/verify voltage generating circuit generates a lower limit of the program state being read for application to the word line of the selected page being read;
- the row read/verify voltage generating circuit generates a pass voltage level to be applied to the word line of the charge retaining transistors connected to the charge retaining transistors of the selected page to turn on the connected charge retaining transistors;
- the row read/verify voltage generating circuit generates a page read inhibit voltage level of approximately the ground reference voltage level to inhibit read of the unselected pages of charge retaining transistors;
- the column read/verify voltage generating circuit applies a read bias voltage level to the global bit lines and thus to the selected charge retaining transistors; and
- the column voltage control circuit connects sense amplifiers to the global bit lines to sense the program state programmed to the selected charge retaining transistors.

57. The operating apparatus for preventing over-erasing of claim 56 wherein the pass voltage level is a voltage level of the upper limit of a largest program state plus a voltage differential of approximately +1.0V.

58. The operating apparatus for preventing over-erasing of claim 43 wherein the column voltage control circuit comprises a well bias control circuit that includes a shallow well generator connected to a shallow diffusion well of a second conductivity type into which the array block of NOR flash memory cells is formed and a deep well generator connected to a deep diffusion well of a first conductivity type into which the shallow diffusion well is formed such that the deep well generator generates a voltage level of the power supply voltage source for programming, verification, and reading of the array of NOR flash memory cells and generates a very large erase voltage for erasing a selected block or page of the array of NOR flash memory cells and the shallow well generator transfers the voltage level of the ground reference voltage source for programming, verification, and reading of the array of NOR flash memory cells and generates a very large erase voltage level that is applied to the shallow well of the second conductivity type to attract the charges from the charge retaining region during an erase.

59. The operating apparatus for preventing over-erasing of claim 58 wherein the very large erase voltage level is from approximately +18.0V to approximately +22.0V (nominally +20.0V) to activate a Fowler Nordheim tunneling phenomena to extract charge from the charge retaining region during the erase.

60. A NAND-like NOR flash cell comprising:
at least two serially connected charge retaining transistors formed within a shallow diffusion well of a first conductivity type that is formed within a deep diffusion well of a second conductivity type;
wherein each of the at least two serially connected charge retaining transistors have a plurality of program states that have threshold voltage levels to prevent leakage currents from over-erasure;
wherein the at least two serially connected charge retaining transistors are erased by:
selecting one of the at least two serially connected charge retaining transistors, erasing the selected charge retaining transistor,
erase verifying that the selected charge retaining transistor has its threshold voltage level less than an upper limit of a voltage level of a first program state,
re-erasing the selected charge retaining transistor, if the threshold voltage level is greater than the upper limit of the voltage level of the first program state and erase verifying until the selected charge retaining transistor has its threshold voltage level less than the upper limit of the first program state,
over-erase verifying that the selected charge retaining transistor has its threshold voltage level greater than a lower limit of a voltage level of the first program state,
programming the selected charge retaining transistor, if the threshold voltage level is less than the lower limit of the voltage level of the first program state until over-erase verifying indicates that the selected one of the at least two charge retaining transistors has its threshold voltage level greater than the lower limit of the first program state, and
sequentially selecting, erasing, erase verifying, over-erase verifying, and programming each of the other at least two charge retaining transistors.

61. The NAND-like NOR flash cell of claim 60 wherein erasing the selected charge retaining transistor comprises:
applying a very large erase inhibit voltage level of from approximately +18.0V to approximately +22.0V (nominally +20.0V) to control gates of the unselected charge retaining transistors of the at least two serially connected charge retaining transistors;
applying an erase voltage level that is a ground reference voltage level to the control gate of the selected charge retaining transistor; and
floating drains and sources of top and bottom charge retaining transistors of the at least two serially connected charge retaining transistors.

62. The NAND-like NOR flash cell of claim 60 wherein erase verifying the selected charge retaining transistor of the at least two charge retaining transistors comprises:
applying a voltage level of the a lower limit of the first program state to the control gate of the selected charge retaining transistors;
applying a pass voltage level to the control gate of the unselected charge retaining transistor or transistors of the at least two charge retaining transistors;
applying a read bias voltage level to the drain of a top charge retaining transistor of the at least two charge retaining transistors; and
connecting a sense amplifier to sense the program state programmed to the selected charge retaining transistor to the drain of the top charge retaining transistor; and
applying a ground reference voltage level to the source of the bottom charge retaining transistor.

63. The NAND-like NOR flash cell of claim 62 wherein the pass voltage level is a voltage level of the upper limit of a largest program state plus a voltage differential of approximately +1.0V.

64. The NAND-like NOR flash cell of claim 60 wherein programming the selected charge retaining transistor of the at least two charge retaining transistors comprises:
erasing the selected charge retaining transistor such that the selected charge retaining transistor has its threshold voltage level greater than the lower limit of the first program state and less than the upper limit of the first program state; and
for the selected charge retaining transistor that is to be programmed to the second program state, generating the program voltage signals to program the selected charge retaining transistors that are to be programmed to the second logic state; and
generating the program verifying signals for verifying that the selected charge retaining transistor is programmed to the second program state.

65. The NAND-like NOR flash cell of claim 64 wherein generating the program voltage signals comprises:
applying the very large program voltage to the control gate the selected charge retaining transistor;
applying the moderately large program inhibit voltage to the control gates of the unselected charge retaining transistor or transistors of the at least two charge retaining transistors; and
applying the ground reference voltage level to the drain of the top charge retaining transistor and the source of the bottom charge retaining transistor of the at least two charge retaining transistors.

66. The NAND-like NOR flash cell of claim 65 wherein the very large program voltage is approximately +15.0V to approximately +20.0V, the large program inhibit gating voltage is approximately +10.0V, and the moderately large program inhibit voltage is approximately +5.0V.

67. The NAND-like NOR flash cell of claim 65 wherein the selected charge retaining transistor is inhibited from programming by generating a program inhibit voltage level of approximately +10.0V to the drain and source of the selected charge retaining transistors that are not to be programmed and to provide the ground reference voltage to the bit lines and source lines of the charge retaining transistors that are to be programmed.

68. The NAND-like NOR flash cell of claim 64 wherein generating the program verifying signals comprises:
generating a lower limit voltage level of the program state being verified for application to control gate of the selected charge retaining transistor;
generating a pass voltage level to be applied to the control gates of the unselected of the at least two serially connected charge retaining transistors to turn on the unselected of the at least two serially connected charge retaining transistors;
generating a read bias voltage level to the drain of the top charge retaining transistor of the at least two serially connected charge retaining transistors;
connecting the sense amplifier to the drain of the top charge retaining transistor of the at least two serially connected charge retaining transistors to sense the program state programmed to the selected charge retaining transistors; and connecting the ground reference voltage level to the source of the bottom charge retaining transistor of the at least two serially connected charge retaining transistors.

69. The NAND-like NOR flash cell of claim 68 wherein the pass voltage level is a voltage level of the upper limit of a largest program state plus a voltage differential of approximately +1.0V.

70. The NAND-like NOR flash cell of claim 60 wherein reading the program state of the selected charge retaining transistor comprises:

applying a lower limit of the program state being read to the control gate of the selected charge retaining transistor;

applying the pass voltage level to the unselected charge retaining transistors of the at least two serially connected charge retaining transistors;

applying a read bias voltage level to the drain of the top charge retaining transistor of the at least two serially connected charge retaining transistors;

connecting the sense amplifier to the drain of the top charge retaining transistor of the at least two serially connected charge retaining transistors to sense the program state programmed to the selected charge retaining transistors; and connecting the ground reference voltage level to the source of the bottom charge retaining transistor of the at least two serially connected charge retaining transistors.

71. The NAND-like NOR flash cell of claim 70 wherein the pass voltage level is a voltage level of the upper limit of a largest program state plus a voltage differential of approximately +1.0V.

* * * * *